United States Patent
Burg et al.

(10) Patent No.: US 12,057,858 B2
(45) Date of Patent: Aug. 6, 2024

(54) METHOD FOR READING AND WRITING UNRELIABLE MEMORIES AND A CORRESPONDING MEMORY CONTROLLER DEVICE AND MEMORY

(71) Applicant: ECOLE POLYTECHNIQUE FEDERALE DE LAUSANNE (EPFL), Lausanne (CH)

(72) Inventors: Andreas Burg, Ecublens (CH); Reza Ghanaatian, Renens (CH)

(73) Assignee: ECOLE POLYTECHNIQUE FEDERALE DE LAUSANNE (EPFL), Lausanne (CH)

( * ) Notice: Subject to any disclaimer, the term of this patent is extended or adjusted under 35 U.S.C. 154(b) by 206 days.

(21) Appl. No.: 17/482,594

(22) Filed: Sep. 23, 2021

(65) Prior Publication Data
US 2022/0122686 A1 Apr. 21, 2022

(30) Foreign Application Priority Data
Sep. 24, 2020 (WO) .................. PCT/IB2020/058936

(51) Int. Cl.
*H03M 13/11* (2006.01)
*G11C 29/12* (2006.01)
*G11C 29/20* (2006.01)
*G11C 29/42* (2006.01)

(52) U.S. Cl.
CPC ..... *H03M 13/1117* (2013.01); *G11C 29/1201* (2013.01); *G11C 29/20* (2013.01); *G11C 29/42* (2013.01); *H03M 13/1102* (2013.01)

(58) Field of Classification Search
CPC .......... H03M 13/1117; H03M 13/1102; H03M 13/116; G11C 29/1201; G11C 29/20; G11C 29/42; G11C 29/52
See application file for complete search history.

(56) References Cited

U.S. PATENT DOCUMENTS

2016/0049203 A1* 2/2016 Alrod ................... G06F 11/073
714/2
2022/0156201 A1* 5/2022 Curewitz ............ G06F 12/0284

OTHER PUBLICATIONS

Y. Lin and W. Niu, "High Throughput LDPC Decoder on GPU," in IEEE Communications Letters, vol. 18, No. 2, pp. 344-347, Feb. 2014, (Year: 2014).*
L. Yuan, Z. Xing, Y. Zhang and X. Chen, "An Optimizing Strategy Research of LDPC Decoding Based on GPGPU," 2013 12th IEEE International Conference on Trust, Security and Privacy in Computing and Communications, Melbourne, VIC, Australia, 2013, pp. 1901-1906, (Year: 2013).*
Balatsoukas-Stimming, A., & Burg, A. (2014). Density evolution for min-sum decoding of LDPC codes under unreliable message storage. IEEE Communications Letters, 18(5), 849-852.

(Continued)

*Primary Examiner* — Cynthia Britt
(74) *Attorney, Agent, or Firm* — Nixon & Vanderhye P.C.

(57) ABSTRACT

A method of accessing a memory space of a memory device with a decoder, the memory space having faults, including the steps of performing a memory access operation by an electronic device to a access a logical memory space of the memory device, and randomizing the memory access operation with a randomization logic to access data from a physical memory space based on the logical memory space, the randomization logic providing time varying behavior for accessing the physical memory space.

16 Claims, 12 Drawing Sheets

(56) References Cited

OTHER PUBLICATIONS

Balatsoukas-Stimming, A., & Burg, A. (2017). Faulty successive cancellation decoding of polar codes for the binary erasure channel. IEEE Transactions on Communications, 66(6), 2322-2332.
Balatsoukas-Stimming, A., Preyss, N., Cevrero, A., Burg, A., & Roth, C. (Jun. 2013). A parallelized layered QC-LDPC decoder for IEEE 802.11 ad. In 2013 IEEE 11th International New Circuits and Systems Conference (NEWCAS) (pp. 1-4). IEEE.
Choi, W., Kang. G., & Park, J. (2015). A refresh-less eDRAM macro with embedded voltage reference and selective read for an area and power efficient Viterbi decoder. IEEE Journal of Solid-State Circuits, 50(10), 2451-2462.
Frustaci, F., Khayatzadeh, M., Blaauw, D., Sylvester, D., & Alioto, M. (Feb. 2014) 13.8 A 32kb SRAM for error-free and error-tolerant applications with dynamic energy-quality management in 28nm CMOS. In 2014 IEEE International Solid-State Circuits Conference Digest of Technical Papers (ISSCC).
Frustaci, F., Khayatzadeh, M., Blaauw, D., Sylvester, D., & Alioto, M. (2015). SRAM for error-tolerant applications with dynamic energy-quality management in 28 nm CMOS. IEEE Journal of Solid-state circuits, 50(5), 1310-1323.
Ganapathy, S., Karakonstantis, G., Teman, A., & Burg, A. (Jun. 2015). Mitigating the impact of faults in unreliable memories for error-resilient applications. In 2015 52nd ACM/EDAC/IEEE Design Automation Conference (DAC) (pp. 1-6). IEEE.
Giterman, R., Bonetti, A., Bravo, E. V., Noy, T., Teman, A., & Burg, A. (2020). Current-based data-retention-time characterization of gain-cell embedded DRAMs across the design and variations space. IEEE Transactions on Circuits and Systems 1: Regular Papers, 67(4), 1207-1217.
Ivaniš, P., & Vasić, B. (2016). Error errore eicitur: A stochastic resonance paradigm for reliable storage of information on unreliable media. IEEE Transactions on Communications, 64(9), 3596-3608.
Karakonstantis, G., Roth, C., Benkeser, C., & Burg, A. (Jun. 2012). On the exploitation of the inherent error resilience of wireless systems under unreliable silicon. In DAC Design Automation Conference 2012 (pp. 510-515). Ieee.
Lee, I., Kwon, J., Park, J., & Park, J. (2013). Priority based error correction code (ECC) for the embedded SRAM memories in H. 264 system. Journal of Signal Processing Systems, 73(2), 123-136.
Lopez, H., Chan, H. W., Chiu, K. L., Tsai, P. Y., & Jou, S. J. J. (2019). A 75-GB/s/mm 2 and energy-efficient LDPC decoder based on a reduced complexity second minimum approximation min-sum algorithm. IEEE Transactions on Very Large Scale Integration (VLSI) Systems, 28(4), 926-939.
Meinerzhagen, P., Bonetti, A., Karakonstantis, G., Roth, C., Giirkaynak, F., & Burg, A. (May 2015). Refresh-free dynamic standard-cell based memories: Application to a QC-LDPC decoder. In 2015 IEEE International Symposium on Circuits and Systems (ISCAS) (pp. 1426-1429). IEEE.
Meinerzhagen, P., Roth, C., & Burg, A. (Aug. 2010). Towards generic low-power area-efficient standard cell based memory architectures. In 2010 53rd IEEE International Midwest Symposium on Circuits and Systems (pp. 129-132). IEEE.
Meinerzhagen, P., Teman, A., Giterman, R., Edri, N., Burg, A., & Fish, A. (2018). Gain-cell Embedded DRAMs for Low-power VLSI Systems-on-chip. Springer International Publishing.
Milicevic, M., & Gulak, P. G. (2018). A multi-GB/s frame-interleaved LDPC decoder with path-unrolled message passing in 28-nm CMOS. IEEE Transactions on Very Large Scale Integration (VLSI) Systems, 26(10). 1908-1921.
Mu, J., Vosoughi, A., Andrade, J., Balatsoukas-Stimming, A., Karakonstantis, G., Burg, A., . . . & Cavallaro, J. R. (Nov. 2015). The Impact of faulty memory bit cells on the decoding of spatially-coupled LDPC codes. In 2015 49th Asilomar Conference on Signals, Systems and Computers.
Mukhopadhyay, S., Mahmoodi, H., & Roy, K. (2005). Modeling of failure probability and statistical design of SRAM array for yield enhancement in nanoscaled CMOS. IEEE transactions on computer-aided design of integrated circuits and systems, 24(12), 1859-1880.
Ngassa, C. K., Savin, V., & Declercq, D. (Dec. 2013). Min-sum-based decoders running on noisy hardware. In 2013 IEEE Global Communications Conference (GLOBECOM) (pp. 1879-1884). IEEE.
Park, Y. S., Blaauw, D., Sylvester, D., & Zhang, Z. (2014). Low-power high-throughput LDPC decoder using non-refresh embedded Dram. IEEE Journal of Solid-State Circuits, 49(3), 783-794.
Ptracu, M., & Thorup. M. (2012). The power of simple tabulation hashing. Journal of the ACM (JACM), 59(3), 1-50.
Roth, C., Benkeser, C., Studer, C., Karakonstantis, G., & Burg, A. (Oct. 2012). Data mapping for unreliable memories. In 2012 50th Annual Allerton Conference on Communication, Control, and Computing (Allerton) (pp. 679-685). IEEE.
Roth, C., Meinerzhagen, P., Studer, C., & Burg, A. (Nov. 20110). A 15.8 pJ/bit/iter quasi-cyclic LDPC decoder for IEEE 802.11 n in 90 nm CMOS. In 2010 IEEE Asian Solid-State Circuits Conference (pp. 1-4). IEEE.
Roth, C., Studer, C., Karakonstantis, G., & Burgi, A. (Nov. 2014). Statistical data correction for unreliable memories. In 2014 48th Asilomar Conference on Signals, Systems and Computers (pp. 1890-1894). IEEE.
Sharon, E., Litsyn, S., & Goldberger, J. (2007). Efficient serial message-passing schedules for LDPC decoding. IEEE Transactions on Information Theory, 53(11), 4076-4091.
Teman, A., Karakonstantis, G., Giterman, R., Meinerzhagen, P., & Burg, A. (Mar. 2015). Energy versus data integrity trade-offs in embedded high-density logic compatible dynamic memories. In 2015 Design, Automation & Test in Europe Conference & Exhibition (Date) (pp. 489-494). IEEE.
Varshney, L. R. (2011). Performance of LDPC codes under faulty iterative decoding. IEEE Transactions on Information Theory, 57(7), 4427-4444.
Yazdi, S. S. T., Cho, H., & Dolecek, L. (2013). Gallager B decoder on noisy hardware. IEEE Transactions on Communications, 61(5). 1660-1673.

\* cited by examiner

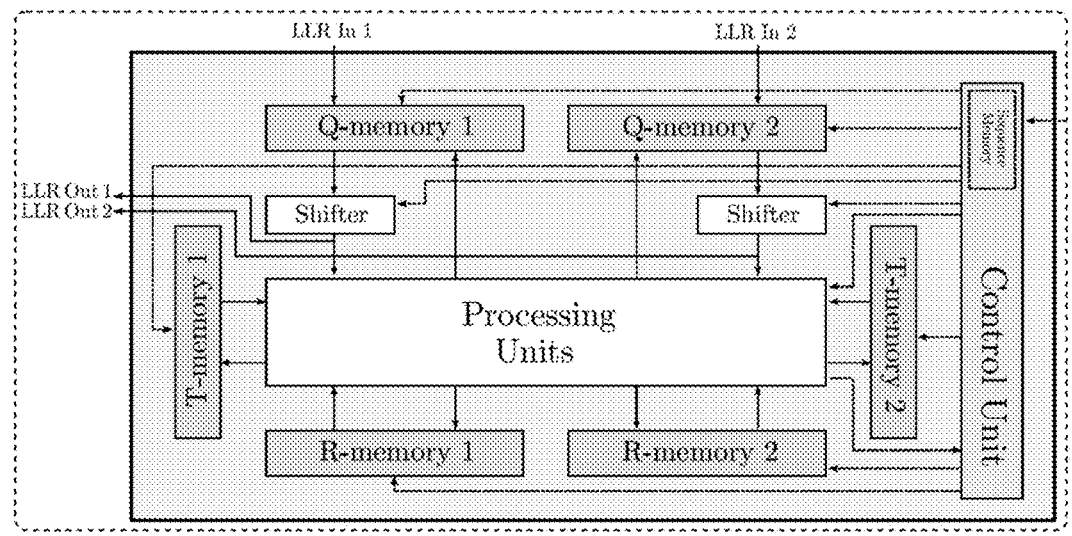
FIG. 2
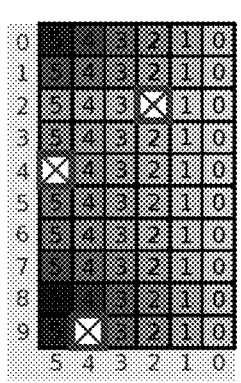
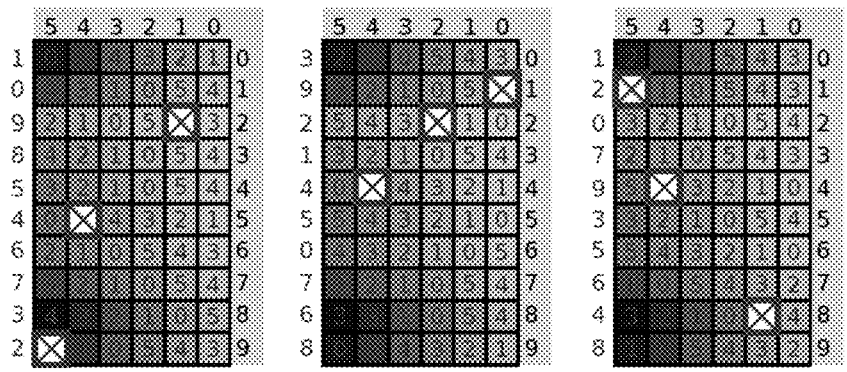
FIG. 3
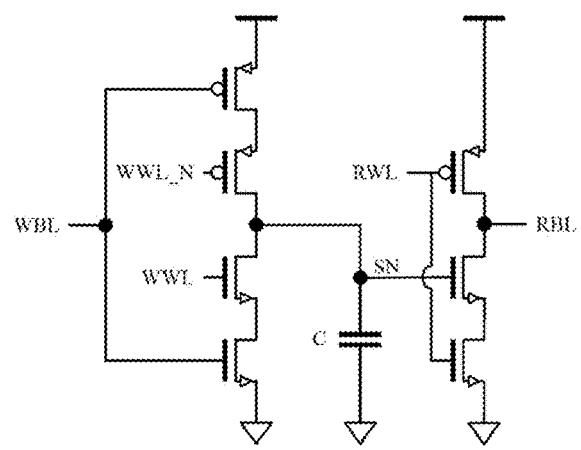
FIG. 4

| Technology | 28 FD-SOI | |
|---|---|---|
| Die area [mm$^2$] | 3 | |
| Decoder core area [mm$^2$] | 1.44 | |
| Vdd [V] | 0.9 | 0.7 |
| Reliable freq. range [MHz] | 57 – 190 | 10 – 52 |
| Power range [mW] | 32.8 – 78.8 | 4.2 – 18.3 |

| Memory | Data lifetime | Min clk for reliable operation with a min DRT= $0.3\,\mu s$ |
|---|---|---|
| T | $10 \cdot T_{clk}$ | 33.3 MHz |
| R | $30 \cdot T_{clk}$ | 100 MHz |

| Publications | This work | [16] | [22] | [13] | [27] | [28] |
|---|---|---|---|---|---|---|
| Technology | 28 nm FD-SOI | 90 nm CMOS | 90 nm CMOS | 65 nm CMOS | 28 nm CMOS | 28 nm CMOS |
| $V_{dd}$ [V] | 0.9 | 1.0 | 1.0 | 0.94 | 0.9 | 0.9 |
| Core area [mm$^2$] | 1.44 | 1.77 | 1.0 | 1.60 | 1.99 | 0.14 |
| Max throughout [Mbps] | 843 | 679 | 600 | 6000 | 6780 | 10500 |
| Power [mW] | 78.8 | 107 | - | 373.6 | 279 | 81 |
| Area eff. [Mbps/mm$^2$] | 585 | 384 | 588 | 3750 | 3410 | 75000 |
| Energy eff. [pJ/bit/iter] | 9.2 | 15.8 | 14.7 | 6.2 | 4.1 | 2 |
| Memory fault mitigation | Yes | - | - | - | - | - |
| Ergodic fault behavior | Yes | - | - | - | - | - |

| Name | Description | Quality metric |
|---|---|---|
| Convolution | Sobel kernel for edge detection on a 128x128 px image | PSNR[1] |
| Disparity Map | Depth map from two 72x54 px images from a stereo camera | PSNR |
| Susan Smoothing | Smoothing of a 76x95 px image with SUSAN principle | PSNR |
| Susan Corners | Corner detection in a 88x66 px image with SUSAN principle | PPV[2] |
| MNIST | Handwritten digit recognition with a neural network | CID[3] |

[1] Peak signal to noise ratio
[2] Fraction of detections being true positives with respect to a reference execution
[3] Percentage of correctly identified digits

FIG. 16

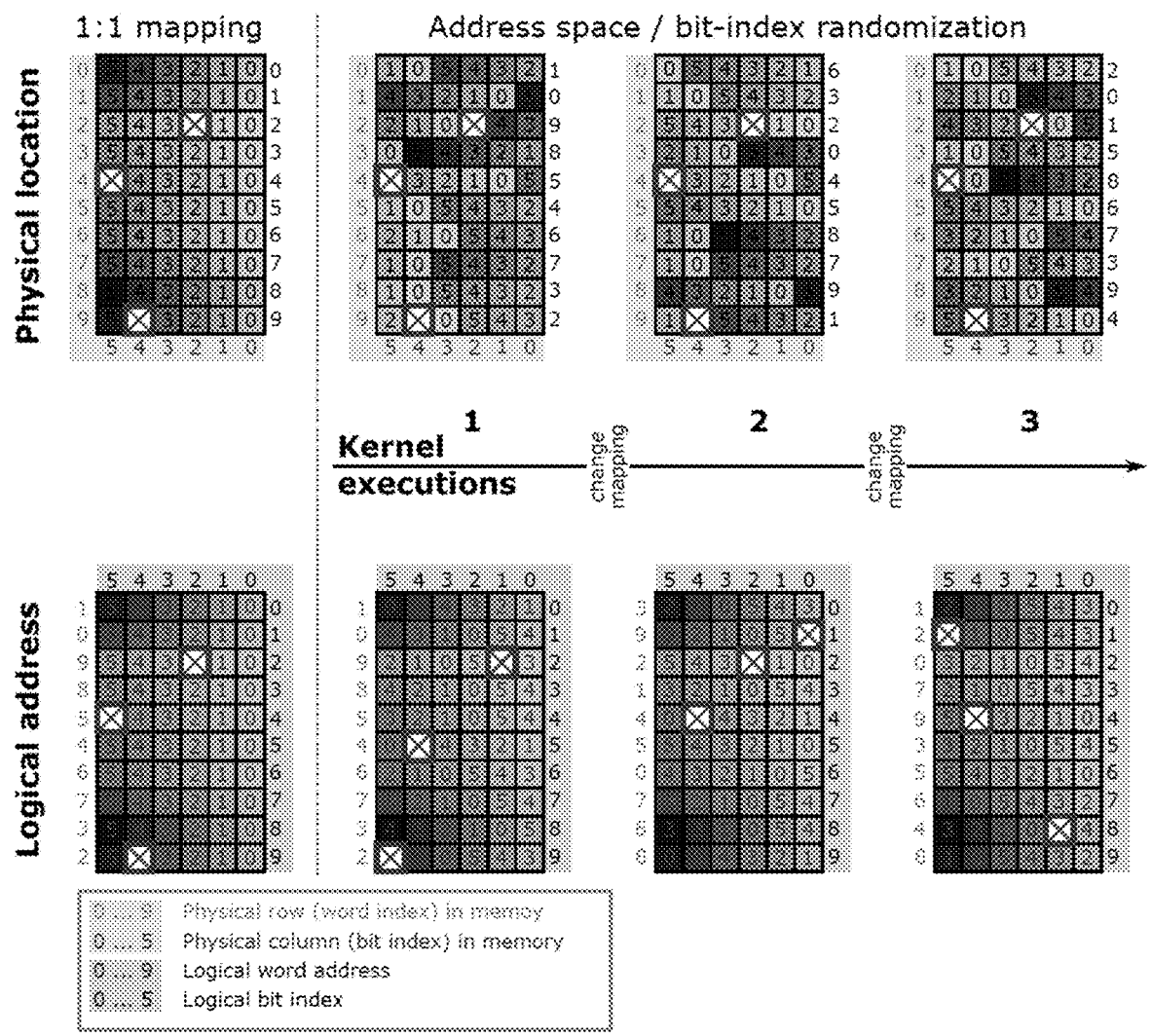

FIG. 17

| SRAM size [KB] | Area [$\mu m^2$] | Area with randomization [$\mu m^2$] | Area overhead [%] |
|---|---|---|---|
| 8 | 15572 | 16240 | 4.2 |
| 16 | 31144 | 31799 | 2.1 |
| 128 | 249152 | 250062 | 0.4 |

[1] SRAM blocks of 8 KB are stacked to build bigger size memories

METHOD FOR READING AND WRITING UNRELIABLE MEMORIES AND A CORRESPONDING MEMORY CONTROLLER DEVICE AND MEMORY

CROSS-REFERENCE TO RELATED APPLICATIONS

The present patent application claims foreign priority to International Patent Application No. PCT/IB2020/058936 that was filed on Sep. 24, 2020, the entire contents thereof herewith incorporated by reference in its entirety.

FIELD OF THE INVENTION

The present invention is directed to the field of the management of faulty memories and more generally the field of approximate computing, more particulary general purpose computing systems and memory controllers using randomizing techniques, and data quality analysis and ergodic processes for reading and writing data to faulty memories, for example by the use of low-density parity check (LDPC) decoders.

BACKGROUND

A plethora of emerging applications constantly rely on the most advanced process nodes to meet stringent energy, cost, and throughput requirements despite a tremendous computational complexity. Unfortunately, the gain from technology scaling is diminishing due to process variations and designers are pushed to look for new sources of computing efficiency. One of the promising approaches is to exploit the quality-slack and fault-tolerance of many applications through approximate computing A. Approximate Computing in Communications Communications systems, such as the 3GPP 5G standard, are a natural and prominent example for systems that may take advantage of the approximate computing paradigm since they are already designed to operate reliably under channel noise and interference. Hence, they exhibit an inherent error-resilience and their associated stochastic error-rate based quality metric can accommodate uncertainties introduced by unreliable computational resources [1]. Hence, there have been significant efforts to understand the impact of unreliable silicon on quality of service in communication systems. Among the many different components in these systems, decoders for forward error-correcting (FEC) codes are a great starting point for these considerations since they are not only one of the most energy and area-critical system components, but are also the foundation of their built-in error-correction capability.

In fact, the solid theoretical basis for FEC coding has triggered numerous research activities in the communications and information theory community to study the behavior of such decoders with unreliable hardware. For example, in [2] the Gallager A and the sum-product algorithm for decoding of low-density parity check (LDPC) codes are analyzed under faulty decoding using density evolution analysis. A similar analysis is provided in [3] for the Gallager B algorithm. Studies of the widely used min-sum decoding with unreliable memories are presented in [4], [5]. The work of [6] shows that faulty decoding may even be beneficial in certain cases as it can help the decoder escape trapping sets that cause error floors. Other types of codes have also been studied in the context of faulty decoding. For example, the work of [7] examines faulty decoding of spatially-coupled LDPC codes, while the work of [8] studies faulty successive cancellation decoding of polar codes.

Unfortunately, most of these studies rely on abstract fault models which imply for example independence and symmetry of errors that arise and disappear randomly at any time and without correlation to allow for analytically trackable results in information-theoretic frameworks. In particular, most of the above studies on fault-tolerance of communication systems and channel decoders consider an average performance across both the input and the fault distribution assuming ergodic fault models. While such models are convenient and tractable in simulations and even with analytical tools, they do not necessarily reflect the actual failure modes of the real VLSI circuits. For example, defects and variations due to the delicacy of the manufacturing process are typically deterministic for each die, but vary from die to die after manufacturing. These differences have a significant impact on the average performance of each die. Therefore, the ensemble-average performance across different dies considered in theoretical studies is meaningless for the study of the quality impact of manufacturing variations.

B. Memory Reliability Issues

Memory elements are the most energy- and area-consuming components in most digital signal processing (DSP) kernels and the first point-of-failure in advanced process nodes. Hence, better, but unreliable memories have received considerable attention for applying approximate computing techniques [9] and various memory specific techniques have been devised to mitigate the impact of potential errors [10], [11].

On the circuit side, the encouraging results from the algorithm analysis have paved the way to consider more risky embedded memory architectures that may compromise reliability for area or power. For example, an unreliable static random access memory (SRAM) with dynamic quality management is presented in [12] that shows improved energy efficiency at the cost of reliability. With the same motivation, other works propose for example gain-cell (GC) embedded dynamic random access memory (DRAM) with no or only limited refresh to store data with higher density, while taking risks in terms of reliable data retention. In the context of communication systems, an embedded DRAM is proposed for example in [13] for an LDPC decoder to achieve a better area and energy efficiency without any periodic refresh. A similar idea has also been proposed in [14] to implement highbandwidth memories for an area and energy-efficient Viterbi decoder. Unfortunately, most of these studies focus primarily on the circuit-level advantages, but do not provide an analysis of the quality impact of the corresponding circuits when error free operation can not be guaranteed. In this case, a test-plan is required that can ensure a minimum quality which to date is still an unresolved problem that can only be managed by considerable design margins.

Generally speaking, integrated circuits (IC) are manufactured in extremely large quantities and customers of chip manufacturers expect that the performance and quality provided by every single chip that is shipped matches a given quality/performance specification. To meet this requirement, chips are tested after manufacturing and those that are at risk to not meet those specifications (e.g., due to manufacturing defects or parameter variations) are discarded. To be able to reliably discard any chip that shows any deviation from the specifications, state-of-the-art testing removes all chips that show any deviation from 100% error free operation under worst-case conditions, for example but not limited to high temperature, low supply voltage. Yet, many of the discarded chips do still easily meet quality/performance specifications, despite slight deviations from 100% error-free operation. This stringent selection not only reduces yield (due to chips being unnecessarily discarded) for a given set of worst-case operating conditions, but it forces designers to incorporate significant guard-bands (e.g., overhead to ensure reliable operation under worst-case conditions) which is costly in energy, power, speed, and area.

The reason why chips with even the slightest misbehaviour cannot be sold today lies in the fact that even with only hundreds of circuit elements (a modern IC has billions), there are trillions of possible failure modes (possible differences of the manufactured chip to the golden, error-free template) that can occur. However, each failure mode can lead to a very different impact on quality/performance. This difference leads to a large quality/performance spread for dies that are not always 100% error free. Unfortunately, test procedures today can only check equivalence of the manufactured circuit with an error-free golden model and in some cases identify these differences. However, they cannot rapidly and reliably derive the impact of any difference on the behaviour of a chip and its quality/performance. Hence, if any, even minor, issue is identified, a chip must be discarded because the severity of the issue is unknown and worst-case assumptions must be made.

SUMMARY

According to one aspect of the present invention, a method of restoring an ergodic fault behavior in faulty memories by accessing a memory space with a randomization logic is provided. Preferably, the method includes the steps of performing a memory access operation by an electronic device to access a logical memory space, randomizing the memory access operation with a randomization logic, to access data from a physical memory space based on the logical memory space, the randomization logic providing a time-varying behavior for the logical memory space to restore an ergodic fault model, even in a case where fixed memory faults are present, for accessing the physical memory space.

According to another aspect of the present invention, a device for accessing a faulty memory space is provided. Preferably, the decoder device includes an input port for receiving a memory access instruction, a data processor for randomizing a memory access operation with a randomization logic to read data from a physical memory space of a memory based on the memory access instruction, the randomization logic providing time-varying behavior for the logical memory space to restore an ergodic fault model, even with fixed memory faults, for accessing the physical memory space of the memory, an output port for physically linking the data processor to the memory for the memor read operation.

According to yet another aspect of the present invention, a system is provided, for example an intergrated circuit system, preferably including a electronic device performing a memory access operation, a memory space having faults forming a physical memory space, and a logic circuit for receiving the memory access operation and for accessing the physical memory space, wherein the logic circuit is configured to randomize the memory access operation with a randomization logic to access data from the physical memory space, the randomization logic providing time-varying behavior for the logical memory space to restore an ergodic fault model for reading the physical memory space.

According to still another aspect of the present invention, a method is provided for achieving stable time-average quality of datta in an integrated circuit by using a device, for example a decoder device, that turns deterministic faults into random faults.

According to another aspect of the present invention, a method of allocating processing resources of a data processor device is provided, the processing resources having faults. Preferably, the method includes the steps of performing an allocation of a data processing resource from a plurality of data processing resources of a data processor device to perform a data operation, and randomizing the allocation of the data processing resourse with a randomization logic to allocate a randomly-chosed one of the plurality of data processing resources, the randomization logic providing time varying behavior for allocation of the data processing resource.

According to one aspect of the present invention, an LDPC decoder chip or circuit is provided. We describe the first LDPC decoder chip, that can provide stable quality across a population of dies with unreliable memories. To this end, we introduce and apply architectural measures to restore an ergodic fault model even in the presence of fully deterministic die-to-die variations. On this foundation, we further introduce measures to reduce the impact of errors by exploiting the beauty of the restored randomness. The measurements show how this an ergodic fault model can be restored for better and more stable quality and how this restored egodic behavior, by randomizing the mapping between logical and physical memory space, allows to operate with confidence even when memories become unreliable.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE SEVERAL VIEWS OF THE DRAWINGS

The accompanying drawings, which are incorporated herein and constitute part of this specification, illustrate the presently preferred embodiments of the invention, and together with the general description given above and the detailed description given below, serve to explain features of the invention.

FIG. 2 shows a schematic and exemplary view of an architecture of a memory design that can take advantage the herein presented method, also shown in reference [17];

FIG. 3 shows different logical memory fault maps (right) are created for a memory with a constant physical fault map (left);

FIG. 4 shows an exemplary schematic for a GC latch for dynamic SCM;

FIG. 16 shows a table with a description of the analyzed benchmarks;

FIG. 17 shows an exemplary illustration of a 1:1 and a randomized mapping of physical locations to logical addresses (changing for subsequent kernel executions)

DETAILED DESCRIPTION OF THE PREFERRED EMBODIMENTS

I. Introduction

Figure 1A:
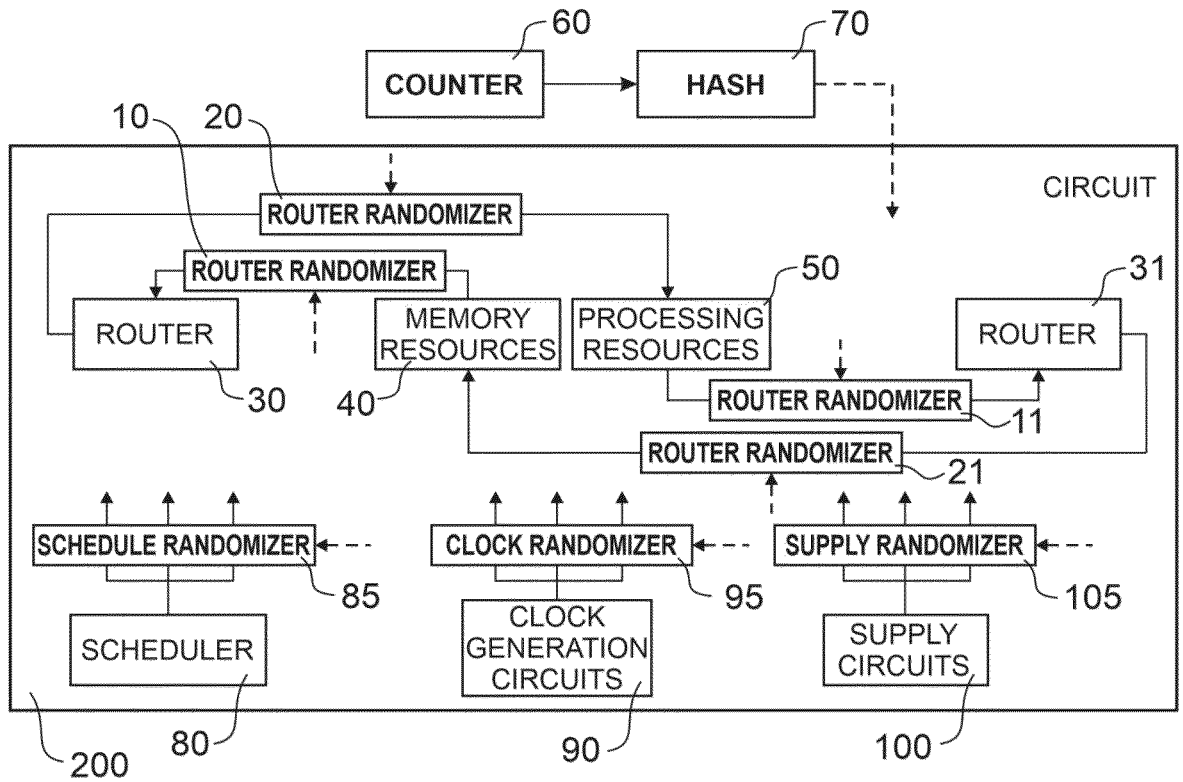
FIG. 1A shows a schematic and exemplary view of a circuit 200 using different exemplary memory read and memory write randomizers 10, 21 for memory reads and memory writes, respectively, and processing resources randomizers 11, 20 for randomizing allocation of processing resources of a data processor, according to an aspect of the present invention.

FIG. 1 shows a schematic and exemplary view of a circuit 200 using different exemplary memory read and memory write randomizers 10, 11, 21, 22 for memory reads and memory writes, respectively, according to an aspect of the present invention. As shown in FIG. 1, a device 200 is shown, for example a device including several hardware elements or software elements or a combination of both, including a physical or virtual memory space, represented as memory resources 40, for example but not limited to a random access memory (RAM) including static random access memory (SRAM), a flash memory, a cloud-based memory, cache memories, buffer memories read-only memory (ROM), magneto-resistive random-access memory (MRAM), resistive random access memory (RRAM), dynamic random access memory (DRAM), embedded dynamic random access memory (eDRAM), embedded gain dynamic random access memory. However, it is also possible that memory resources 40 include different types of image sensors having pixels that can be read like memories. With respect to the processing ressources 50, this can be any type of device, process, method, or software element that can perform some type of data processing, for example but not limited to a microprocessor, graphics processor, microcontroller, field-programmable gate area (FPGA), application-specific integrated circuit (ASIC), complex programmable logic device (CPLD) or other types of programmable chips, or software-based data processors such as but not limited to data processing objects, clould-based data processors, artificial intelligence networks. Router 30 is used to provide for a physical or logical link between different processing resources 50 and different memory resources 40 according to the operaton to be executed, via a router randomizer 10, 20, randomizer 20 serving for read operations from memory resources 40, and randomizer 10 serving for write operations to memory resources 40. A counter 60 can be provided, configured to count executions that are performed by a kernel, processing core, or part of software intructions executed by a program that is performed by processing resources 50 of the circuit 200. In addition, a hash device or element 70 can be provided, configured to use an input value of the counter as seed value or random seed for random number generation, but also can use status bits of circuit 200, for example from processing resources 50 or from a scheduler 20, or controlling the Routers 30, to provide for randomizer control signals. In some embodiments, the hash function can also be a trivial pass through of the counter signals. These pseudo-random randomizer control signals can be provided to router randomizers 10, 20, or other types of randomizers, such as the schedule randomizer 85, clock randomizer 95, or supply randomizer 105, or other router randomizers 11, 21. The router randomizers 10, 20 can determine (a) the assignment of data from the memory resources 40 or operationgs to a processing resource 50, and (b) the assignment of data to memory resources 40, and (c), and the setting of operation parameters over time, for example in processing resource 50, clock generation circuits 90, or supply generation circuits 100.

In a design according to the state of the art, the schedulers 80 can be deterministic and their behaviour is identical for every execution of the same algorithm or software on the device 200, provided that device 200 is being operated on exactly the same data and the same operating conditions. However, according to one aspect of the present invention, the counter 50 provides for input to hash device or element 70 that allows to provide a different seed value or random seed to the hash element 70, even if data on which the circuit 200 operates is the same. The different randomizers 10, 20, 11, 21, 85, 95, 105, according to an aspect of the present invention, are designed to alter the signals of the corresponding blocks to deliver multiple, or at least in one part different signals for circuit 200 carry out the same function, but with at least in part differences in how the circuit 200 is utilized or operates. According to an aspect of an embodiment of the invention, randomizers 10, 20, 11, 21, 85, 95, 105 can also be merged with the corresponding parts from which they receive signals for optimization, for example in the design process or during subsequent automatic optimization steps, for example being part of the same FPGA, subcircuit, or software object. In a 100% error free circuit, these randomized operations lead to the same outcome, but in a circuit with a deviation from a desired reference design, the outcomes are different even if the specific deviation remains the same. Consequently, even with a given specific deviation, all manufactured faulty chips produce outputs that are different for multiple executions of the program, for example expressed by different states of the counter 60.

In a specific embodiment, circuit 200 can include Boolean functions including arithmetic units and local registers as different types of processing ressources 50, and storage arrays as memory resources 40. Data bits are written to memory resources 40 and read again from memory resources 40 to be sent to processing ressources 50 for different types of computations on the data. The result of the computations are written back to memory resources 40. Each bit is stored in a physical or logical storage element of the memory resource 40, and one or multiple addresses select to which words in the memory data are written and from which word data is read. The router 31 select in which bit of the selected words a bit from the processing resource 50 is stored as determined by scheduler 80. The router 30 selects and from which bit of the selected words a bit is read to be sent to the processing resources 40 as determined by scheduler 80. The address and parameters for the routers 30 31 are determined by scheduler 80. In its conventional form, scheduler 80 provides for the address and the routers 30 31 can provide for a fixed assignment of data bits storage elements of memory resource 40 at any time circuit 200 is operated. According to an aspect of the present invention, counter 60 provides a new random seed or seed value for every execution of the program code which can lead to the generation of pseudo-random control signals, generated by hash element or device 70 for the different randomizers, for example the router randomizers 10, 20,11, 21. Schedule randomizer 85 can thereby produce valid address sequences that depend on the original signals of the scheduler 80, and an output of hash element or device 70. Routing randomizers 10, 20, 11, 21 can generate valid signal routings that depend also an output of hash element or device 70. For this particular example, routing randomizers 11, 21 that connect processing resource 50 to the memory resources 40, and routing randomizers 10, 20 that connect memory resources 40 to processing resources 50 only need to perform inverse signal permutations for any control input for a given hash input from hash element or device 70. The addresses for writing to memory area of memory resources 40 and the corresponding addresses for reading from the memory area of memory resources 40 for a given control input from scheduler 80 need to be identical for a given set of corresponding inputs from scheduler 80 and from the value of hash element or device 70, so that data that is written to a location in the memory area of the memory element and should be read again is the same but different for different hash values at least for some inputs from scheduler 80 so that the memory resource stores some data in different locations of the memory area for different hash values. This can be achieved for example by using any unique mapping that affects read and write addresses in the same way in the schedule randomizer 80 and routing randomizers 10, 20 and 11, 21 in the inverse way.

Figure 1B:
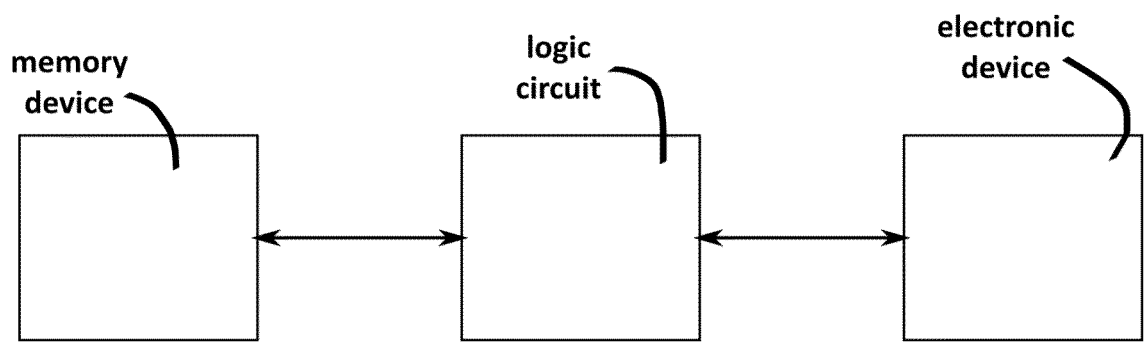
FIG. 1B shows a simplified schematic of a system or device for accessing a memory circuit, for example a memory circuit having a physical memory space, by using a randomization logic, for example with a logic circuit.

For example, a logic circuit can be provided, operatively arranged between an electronic device or a computer process that is configured to perform memory read and write operations, and a physical memory space or device, from which the data is to be read or to be written to, as exemplarily illustrated in FIG. 1B. The logic circuit, upon receiving a read operation to read from a specific memory location of the physical memory space, for example when reading a data word having a plurality of memory bits, the arrangement of bits within the word is changed by a first permutation by using the hash value as a specification for the rearrangement, such that the bits are arranged to new, randomly arranged order within the word. Next, when writing a data word back to the same memory location of the physical memory space, the logic circuit again re-arranges the bits within the word by a second permutation, the second permutation being an inverse permutation of the first permutation. Thereby, when performing the read operation and thereafter the write operation, whilst performing a random rearrangement operation of the bits at the read operation, the placement of the bits within the word at the same address is transformed back to the original arrangement at the write operation. In a similar way, as another example, the logic circuit upon receiving a read or write operation alters the corresponding address before passing it on to the memory device using a hash value for the specification of the alternation. In this case, the read and the write addresses are altered in the same way, such that the read and write operations are the inverse of each other and access the same physical memory address which can be different from the logical address provided by the electronic circuit.

According to some aspects of the present invention, a device or system can be provided, that can be realized in hardware as well as in software or a combination thereof, that restores the equality of the quality of different chips or circuits that are subject to different specific manufacturing outcomes. This device is part of the integrated circuit or the software that runs on it or part of the logic that is programmed onto a programmable part of the integrated circuit.

Next, different embodiments are discussed. For example, in Section II, the basics of LDPC codes and the corresponding decoding algorithm are discussed, as an application example. We also argue that the widely-assumed ergodic fault model LDPC decoding with unreliable memories is incorrect. We then propose a more realistic hardware fault model and a suitable quality evaluation methodology in Section III. approach to restore the ergodic behavior to stabilize the quality across the population of dies is explained in Section IV. Section V presents the baseline decoder architecture, the memory design specifications and the chip architecture. The chip specifications and measurement results are provided in Section VI. Section VII concludes the paper.

II. Discussion on LDPC Codes and Decoding

In this section, we briefly review LDPC codes and the message passing decoding algorithm for hardware implementation and we briefly discuss the reference design. Further, we overview the common performance evaluation approach for faulty decoders in the corresponding literature to set the stage for our proposed evaluation methodology.

A. LDPC Code and Decoding

An LDPC code C is defined by its m×n sparse binary parity-check matrix $H$ as $$C = \{c \in \{0,1\}^n : Hc = 0\},$$

where additions are performed modulo-2 and 0 denotes the allzeros vector of length m. LDPC codes can also be represented using a Tanner graph, which contains nodes of two types, namely variable nodes and check nodes. A variable node i is connected to a check j if, and only if, $H_\mu = 1$. Quasicyclic LDPC (QC-LDPC) codes are a particular class of LDPC consists of cyclically shifted codes with a structured by $I^\alpha$, where Z is the lifting factor of the code and M×$N_Z$×block parity-check matrix that Z identity matrices denoted$_\alpha$ denotes the shift value. The corresponding shift coefficients of the parity check matrix are defined in the prototype matrix a of the code. For completeness, we also define the all-zero matrix $I\infty = \mathbf{0}_{Z \times}/Z$. Note that for QC-LDPC codes we have n=ZN and m=ZM.

For decoding QC-LDPC codes, most hardware decoders use layered offset min-sum (L-OMS) decoding [15]. In the layered decoding schedule, first all messages flowing into and out of the first layer are calculated. Then, the messages flowing into and out of the second layer are calculated, using the information that has already been updated by the first layer and so forth. More formally, let $Q_i$ denote the outgoing message at variable node i and let $R_{j,i}$ denote the corresponding incoming message from layer j. When processing layer j, the L-OMS algorithm calculates $$T_i \leftarrow Q_i^{old} - R_{j,i}^{old}$$

$$R_{j,i}^{new} \leftarrow \max\left(0, \min_{k \in N_j/i} |T_k| - \beta\right) \prod_{k \in N_j/i} \text{sign}(T_k),$$

$$Q_i^{new} \leftarrow T_i + R_{j,i}^{new},$$

for every $i \in N_j$, where $N_j/i$ denotes the set of all variable nodes connected to check node j except variable node i, and β is an empirical correction factor called the offset. After the values have been updated, we set $Q^{old}_i \leftarrow Q^{new}_i$ and $R_{i,j}^{old} \leftarrow R_{i,j}^{new}$. An iteration is completed when all layers have been processed. The initial values for $Q^{old}_i$ are the channel log likelihood ratios (LLRs), i.e., $$Q_i^{old} = \ln\left(\frac{p(y_i | x_i = +1)}{p(y_i | x_i = 1)}\right)$$

where is the channel output at codeword position|i and $-x_i$ is the $y_i$ corresponding input. All $R_{j,i}^{old}$ are initialized to 0. When the maximum number of iterations has been reached, decoding stops and hard decisions are taken based on the signs of $Q^{new}_i$.

B. LDPC Decoder Reference Architecture

The present method and device is based on the configurable L-OMS QC-LDPC decoder described in [16], [17]. Since our primary objective is to demonstrate the behavior with unreliable memories and to alleviate the corresponding quality issues, we keep this architecture unaltered. The main building blocks of this decoder, as shown in FIG. 2, are processing units, which contain 2Z processing elements implementing the L-OMC algorithm, shifters, which implement the cyclic shift required for processing each block of the QC-LDPC parity check matrix, and Q-, T-, and R-memories, which store the messages in the L-OMS algorithm, as explained in (2), (3), and (4). The Q- and T-memories have sizes N Z $N_Q$ and N Z $N_T$ bits, respectively, where $N_Q$ and $N_T$ are the number of quantization bits. The R-memory is larger with $N_{nnz}$ Z $N_R$ bits, where $N_{nnz}$ is the number of non-zero blocks in the prototype matrix and $N_R$ is the number of quantization bits. These memories are the main area- and power-consuming components of the decoder.

C. Problems with Faulty LDPC Decoding Error Models and Performance Evaluation Methodology The common approach to analyze the quality impact of memory faults during behavioral simulations is to randomly inject errors into the memories and compute an average quality across many Monte-Carlo simulations. This corresponds to an ergodic fault model that does not distinguish between the behavior of a given faulty die or chip over different inputs and the behavior of multiple dies or chips. We argue that this ergodic average quality in the related literature (e.g., [2], [3], [4], [5], [6] and references therein) does not reflect the potential quality differences in a population of dies or chips, even if they have the same number of error-prone memory locations.

The issue with this misconception is the considerable quality spread across manufactured dies, which is only acceptable for high-volume production if dies or chips with insufficient quality can easily be identified and discarded. The corresponding test procedure must be sufficiently straightforward and must have a low time complexity. Unfortunately, such quality parametric tests are currently not available.

III. LDPC Decoder Performance Evaluation Under Memory Faults

Anticipating the presence of memory reliability issues in high-volume production, requires an early understanding of the quality distribution in a population of dies or chips to ensure a sufficient quality-yield. To this end, we incorporate a simplified, but sufficiently accurate high-level fault model into behavioral simulations and we employ a simulation methodology that predicts the quality-yield for a given (worst-case) operating point. This prediction then helps us to understand the advantages of the architecture and circuit techniques described in Section V to mitigate the impact of errors.

A. Memory Fault Models

In this paper, we consider only errors that are caused by within-die process variations. The probability for a bit-error in a memory depends on many parameters that are related to the specific memory circuit design, the process, and the operating conditions. Unfortunately, such models are too detailed to be included in high-level simulations that predict algorithm quality through millions of Monte-Carlo simulations across different data inputs. It is therefore common practice [2], [3], [4], [5], [6], to abstract the implementation details with an ergodic fault model that assumes that errors manifest randomly over time with an error probability $P_b$. This error probability is derived from various publications that discuss the error rate in memories, based on detailed circuit models that capture the impact of manufacturing variations through Monte-Carlo analysis.

However, we modified this model according to the fact that memory errors are always stuck-at, and therefore, we consider an i.i.d random stuck-at model with equal probability for both polarities and the manufacturing error distribution probability of $P_b$.

The second model is chosen to better reflect the reality and is more accurate than the commonly assumed ergodic i.i.d model. To this end, we consider a non-ergodic model with deterministic stuck-at errors in the memory, where the exact position of the error in the fault map is chosen with a uniform distribution and the error polarities are chosen with equal probabilities for the realizations of the fault map. More specifically, we generate a population of decoders where the T and R-memories follow this model, but the fault map of each decoder remains unchanged during the entire simulation. This model is based on the observation that errors are different for each memory as different outcome of the production process, however, they remain stable for that specific memory over time. We will confirm this model later by providing measurement results in Section VI.

In addition to the location and polarity of errors, the number of errors $K_e$ for a given bit-error probability $P_b$ that appear in a memory instance of a given size $N_b$ is described by a binomial distribution [11] as $$K_e \sim \binom{N_b}{K_e} P_b^{K_e} (1-P_b)^{N-K_e}.$$

We however note that for small bit-error probabilities this distribution is very peaky. Hence, there are only very few relevant groups for the number of failing bits that are weighted by the probability of occurrence depending on the memory size. We approximate these few groups by only one and we define error ratio equal to the bit-error probability. Given this approximation, and by multiplying this error ratio to the memory size $P_b N_b$ a fixed number of errors are dictated, which are actually injected in a memory across all instances of the simulation for both of the error models.

B. Simulation Environment

In order to obtain a more meaningful understanding of the memory faults on the performance of the decoder, we propose to perform the analysis over a population of dies. This analysis generates a population of dies $n \in N$ with their individual fault patterns en and studies the time-average performance for each die. More specifically, two nested loops are used to evaluate the performance of the decoder dies. While the outer loop iterates over different dies, the inner loop iterates over input statistics and averages over time to evaluate the error correcting performance of the each decoder die.

We use a simulation model for the decoder, which is a bit-true model of the actual fixed-point architecture, considering also the chosen number representation. Note that this is necessary to model the exact behavior of what is actually stored in memory. Particularly, temporal values $T_i$ are derived and stored (in the T-memories), variable-to-check messages are never actually stored as they are derived locally from previously stored check-to-variable messages (in the Rmemories) and from separately stored intrinsic LLRs (in the Qmemories), as explained in (2), (3), and (4). Further, the faulty decoding is enabled by applying (injecting) bit errors during each memory read (in each decoding iteration) according to a fault map that describes the fault model realization for each die.

C. Performance Evaluation Results

To analyze the performance of the population of dies, the cumulative density function (CDF) of the decoder performance metric is considered, i.e., the frame-error rate (FER) rather than any average performance across all the dies. The CDF of the FER illustrates the entire performance range of all the dies, which can be used to study the effect of memory fault on the decoder as well as to analyze yield of faulty dies.

We demonstrate the performance of population of decoder dies using the presented simulation environment. We run the decoder with 10 iterations and we assume $N_Q = N_T = N_R = 6$, which results in 8325, and 24975 bits for the faulty part of the T- and R-memories respectively.

We observe that the error rate performance of each decoder chip instance is different and deviates significantly from the chip ensemble average performance which is therefore meaningless. Our results can further examine the yield at a desired FER requirement. Targeting a FER below $10^{-2}$, we observe that the decoder with ergodic fault model easily achieves a 100% yield, while almost 40% of the decoders with non-ergodic fault model (i.e., different fixed faults for each decoder instances) fail to achieve this target by far.

IV. Improving the Performance Across the Population of Dies

The main issue with the ergodic fault model is that memory errors are mostly deterministic after manufacturing for each individual die, which results in a deterministic, but different performance for each die. Among these dies, there is a considerable quality variation, which would invalidate any average-quality analysis and complicate the quality-yield characterization. In this section, we discuss our proposed measures to improve the performance across the population of decoders. Specifically, we propose to restore the ergodic behavior across the memory faults by restoring the beauty of randomness, while we verify the effectiveness of this idea with silicon measurement later in Section VI. Next, we propose to exploit the randomized memory faults and the resulting behavior of the decoder to improve the performance by repeating the decoding attempts for unsuccessful codewords.

A. Restoring the Ergodic Behavior

Motivated by the above observation and given the fact that memory errors in each individual die are deterministic and thus any averaging across the dies is not legitimate for performance evaluation of each die, we propose to modify the memory faults in a way that the behavior of each die alters over time. More specifically, we propose to randomize the errors between independent subsequent codewords as well as between the subsequent decoding iterations of a codeword. This measure provides a different realization of a random fault map for each execution of the decoder and leads to a more ergodic quality behavior of the faulty hardware. As a result, the timeaverage behavior of each decoder die corresponds better to the chip ensemble-average over the population of decoder dies. In another words, while the quality of some decoders with a low FER penalty compared to the fault-free decoder degrades, the quality of others with a high FER penalty improves. Overall, the quality variance significantly shrinks, which allows to guarantee a significantly better minimum-quality.

In order to realize a random behavior for the decoder's faulty memories, error locations should move across the memory arrays. Additionally, error polarities should be altered randomly to provide randomness in the stuck-at polarity. Since errors cannot be moved freely across the memories, we propose to shuffle the bits in an LLR, shuffle LLRs across a memory word, and shuffle the word addresses over different decoding iterations and codeword decodings. This measure creates a logical memory with a different fault map over time with the same physical faults. If the shuffling is performed randomly each decoding iteration experiences different fault maps, i.e., an ergodic process.

FIG. 3 illustrates how the proposed randomization scheme is effecting the memory. In FIG. 3, the physical view of the memory is shown on the left with errors in address and bit-index pairs of (2, 2), (4, 5), and (9, 4). By randomizing the physical memory address and the bit index, a logical memory is created that shows a different fault map. Three examples of this logical view are provided on the right side of FIG. 3. In the first example, which corresponds to one realization of the randomization scheme, the above physical address and bitindex pairs are converted into logical pairs of (9, 5), (5, 4), and (2, 1), while this conversion is different for other realizations. Since the logical faults are relevant from the viewpoint of the decoder, the proposed method converts a non-ergodic fault map into an ergodic process.

We re-evaluate the performance of the decoder using the simulation environment while the decoder simulation model is verified so that the memory faults are randomized, as explained. We observe that the variance across different dies becomes very small and is heavily reduced compared to the results corresponding to the non-ergodic fault model. This smaller performance variance indicates that the fault behavior becomes ergodic, and therefore, the time-average behavior for each deof all the decoders dies. We conclude that the performance of inferior decoder dies improves and matches the chip ensembleaverage performance. Consequently, the yield at a target FER is significantly improved. Considering a FER below $10^{-2}$, almost all the decoders with a randomized fault model achieve the target FER, while only 60% of the decoders with nonergodic faults achieve this target.

B. Improving the Performance by Exploiting the Random Behavior of Logical Faults The proposed randomization technique essentially converts the deterministic physical memory faults into random logical faults. In other words, each decoding attempt experiences a different fault realization, which results in a similar timeaverage quality across multiple decoder dies, as already discussed. In addition to this ergodic behavior of the decoders, the randomized faults are (ideally) independent from each other, which would result in an independent behavior for different decoding attempts even with an identical codeword. This property can be exploited to improve the decoder performance, which provides the motivation for our proposition.

Recall that if multiple events $B_i$ are independent the following holds $$Pr\left(\bigcap_i B_i\right) = \prod_i Pr(B_i)$$

In another words, the joint probability of multiple independent events is the product of the probabilities, which is always smaller than each of their individual probabilities. We therefore propose to exploit the relation in the equation above to reduce the probability of failure in the decoder. Specifically, we propose to repeat the decoding for the codewords that are unsuccessfully decoded with a different realization of the randomized faults. Since the decoding attempts are (ideally) independent from each other as the result of independent logical faults, the joint probability of an unsuccessful decoding over all repetitions decreases as compared to one repetition. For example, it is less likely to have two subsequent decoding failures as compared to only one failure attempt. Therefore, by repeating the decoding attempts, it becomes more likely that one of the decoding attempts succeeds. In practice, the repetitions can continue until a maximum is reached or the codeword is decoded successfully.

We evaluate the performance over the population of decoders with the randomized non-ergodic faults while we enable the above-explained repetition for the unsuccessful decoding attempts. Note that the unsuccessful decodings can be trivially recognized by monitoring the syndrome (see (1)). Up to 1, 2, or 3 extra repetitions are performed. By comparing the results with one extra decoding attempt, against the reference simulation without any extra attempt, it can be observed that a significant improvement in the decoder performance is achieved, which is up to an order of magnitude for some of the decoders such that the FER penalty compared to the non-faulty decoder, becomes small. The improvement saturates as we move to higher number of repetitions due to the fact that the decoding attempts are not completely independent, as they still process an identical codeword. We further see that the variance across multiple decoders is reduced compared to the reference plot since the inferior decoders (with higher frame error probability) get more chances to repeat the decoding as compare to the superior decoders (with lower frame error probability). Such a lower performance variance indicates a higher yield at a target FER. We note that the key ingredient for the success of this idea is the proposed randomization techniques as it allows to realize different independent memory faults and enable the above improvement, while the performance of a decoder with deterministic memory faults would not change by repeating the decoding iterations.

V. Chip Architecture

According to some aspects of the present invention, a chip has been extended with randomization logic to restore an ergodic fault behavior by accessing the memory with the randomization logic. Test chips with and without this feature allow to study the impact on the decoder performance. In this section, we present the architecture of these chips, and the key building blocks that enable the fault injection and fault randomization, as well as the test infrastructure integrated inside the chip to track and measure the memory errors.

A. Baseline Architecture

In this work, we use the architecture of a QC-LDPC decoder presented in [17]. We discussed the basic functionality of this architecture in Section II. We will elaborate on the details of this architecture and how it is extended for memory fault injection in the chip. The architecture implements the LOMS algorithm by processing and storing the messages in Q-, T-, and R-memories, as shown in FIG. 2. More specifically, the layers are processed one after another while the processing of each layer is decomposed into multiple cycles. The architecture process Z independent check nodes of a layer simultaneously, using Z processing units. To this end, the corresponding Z Q and R-values are read from the associated Q- and R-memories while Q-values are shifted using cyclic shifter based on the entries of H. The temporary T-values of (2) are calculated by the MIN units and stored in the T-memory. Once the MIN units have finished processing all non-zero blocks in a row of the block parity-check matrix, the SEL units use the resulting minimum and second-minimum, sign and T-values to update Z R-values and Q-values according to (3) and (4). In a purely sequential manner each phase takes 2N clock cycles, where N is the number of rows of the block parity-check matrix, however, the architecture overlaps the two phases of two layers and process a single layer with N+2 clock cycles. In addition to this overlap, the decoder throughput is increased by using a semi-parallel architecture for processing each layer by doubling the number of processing units and dividing each of the memories into two arrays with half the size, as described in [17]. As a result, the number of cycles per layer is reduced to dN/2e+2.

B. Memory Design

The decoder architecture includes two types of memory circuits: SRAMs for the reliable and dynamic standard-cell memorys (SCMs) for the faulty memories. SCMs were first proposed in [21], and it is widely recognized that they have significant advantages over conventional SRAMs, especially for small macros in accelerators, in terms of power consumption, robustness to voltage scaling, and data locality. The concept of using dynamic SCMs as a memory in an accelerator was discussed in [22].

The core component of the faulty memories is a specific type of SCM, in which the latch is designed based on a dynamic storage mechanism, i.e., a dynamic GC latch, as in [22]. The latch has an integrated NAND gate for the ANDOR MUX tree SCM read-multiplexer as shown in FIG. 4. In this latch, the logic level of the write-bit-line (WBL) is copied onto the parasitic capacitance (C) on the storage node (SN) whenever the write-word-line (WWL) and its complement (WWL N) are asserted. While the read-word-line (RWL) is inactive, the output read-bit-line (RBL) is always driven high and has no impact on the OR tree of the SCMs output MUX. When RWL is asserted, the state of the SN determines whether the RBL stays charged to VDD (for '1') or discharges to GND (for '0').

This dynamic latch requires seven (7) transistors as compared to the conservative static CMOS latch that comprises twelve (12) transistors, owing to the fact that the dynamic latch does not include a feedback that maintains the state of the GC storage node. Hence, the charges that are stored on the storage node leak away over time and the memory loses its content when no new data is written into the node. Therefore, it requires periodic refresh operations to avoid the loss of data. The refresh period for a GC based memory is determined by its data retention time (DRT) [23], [24] that is defined as the maximum time interval between a write operation and a successful read operation. Both the parasitic capacitance C as well as the leakage currents determine the DRT of the latch. Although the dynamic storage can be used for reliable operation as shown in [22], [13], they can also be used for a controlled fault injection by relaxing the corresponding refresh period and violating the DRT of the dynamic storage elements, as explained in the following.

Figure 5:
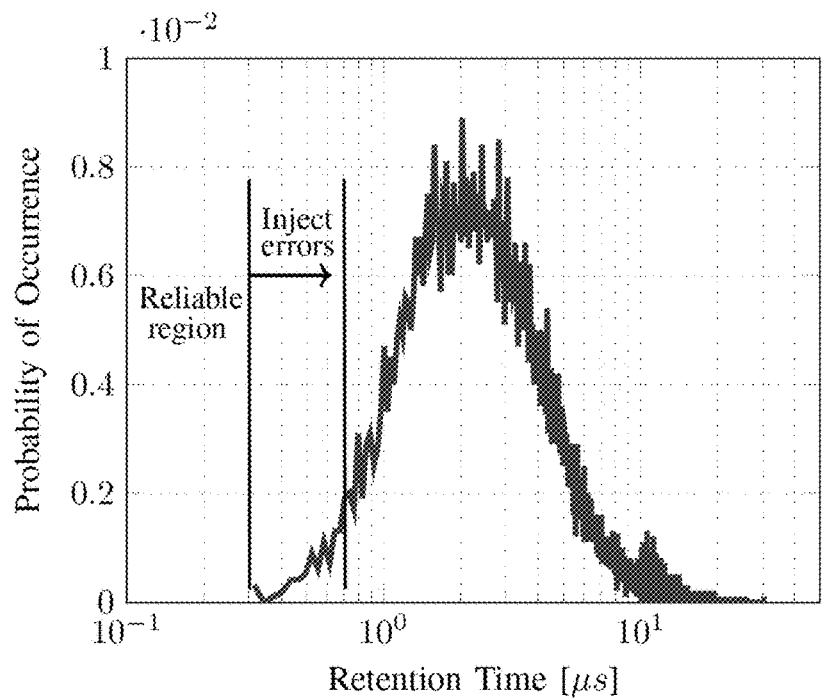
FIG. 5 shows a graph representing the DRT distribution for the proposed GC acquired from a Monte-Carlo simulation on a memory with a 10 kbit size and in a typical operating condition.

1) Fault Injection Mechanism: Sub-threshold leakage is the most prominent and has the most substantial impact on the DRT of the above GC latch among the different leakage mechanisms in the employed 28 nm fully depleted silicon on insulator (FD-SOI) technology [23]. Since this leakage depends exponentially on the threshold voltage VT of the write access transistors, which is a manufacturing parameter that is subject to inter-die and intra-die variations, it varies substantially, both between different chips and also between different bit-cells on the same chip, which results in different DRT. The probability distribution of the DRT values for the bit-cell of FIG. 4 is shown in FIG. 5. The distribution is acquired based on Monte-Carlo simulations for a memory with a 10 kbit size and a typical operating condition, which shows the large variation among the DRT values. Further, the DRT distribution has a long tail toward zero [25], which leads to a conservative and costly margin in a reliable design approach since it requires consideration of the bit-cell with the worst-case (shortest) retention time across dies, operating conditions, and bit-cells within the array on the same die. However, we exploit these long tails here as the key to enable a graceful degradation of the reliability, i.e., a slow increase of the number of failing bits, over a large tuning range for the lifetime of variables in the memory by reducing frequency.

2) Data Lifetime in the Memories and Fault Injection: The errors occur in the memory due to DRT violation of the dynamics SCMs, and therefore, timing characteristics of the decoder architecture are particularly relevant. Such errors occur depending on the lifetime of the data in a memory, which is given by the number of cycles between a write and the last read to the same address prior to the next write, $N_c$, and the period of the clock: $T_{life} = N_c T_{clk}$. In the decoder architecture, R-values are re-written in each iteration and the T-values are re-written in each layer. This is correct if the prototype matrix of the code does not include I∞ elements. Since the employed semi-parallel architecture processes each layer in $dN/_T 2_{clk}e+2$ and the T-valuesclock cycles, lifetimes are the R-values lifetime is $(dN/2e+2)_M T_{(clk^i N/\cdot 2^e+2)}$ Dynamic bit-cells are designed to provide a very large DRT margin compared to the lifetime of the messages stored in Rand T-memories when the decoder operates near its maximum frequency. Therefore, the minimum clock frequency for a reliable operation assuming a minimum DRT is well-below the decoder maximum frequency. This minimum clock frequency is provided in FIG. 11 that shows a table with data for a minimum DRT of ≈0.3 μs from the retention time distribution of FIG. 5. This margin ensures that all bits are stored reliably, even for bit-cells with a comparatively high leakage and thus a short DRT. To inject errors, based on the process variations, we can increase the clock period and thereby increase the data lifetime in the memory without changing the DRT of the bit-cells, as illustrated in FIG. 5. Due to the long tail of the DRT distribution, the number of failing bit-cells will increase only slowly, while lowering the clock frequency enables a gradual increase in the number of failing bit-cells.

C. Address & Bit-Index Randomization

In order to realize the ergodic fault statistics in the decoder memories, error locations and polarities should alter over time. More specifically, memory address and data should be scrambled to create different logical memories with random faults over the course of decoder iterations or processing of the layers. We note that enabling an ideal randomization similar to FIG. 3 for the decoder memories with a wide memory bus imposes a non-negligible overhead as it requires to shuffle the bits across different LLRs in such a wide bus. The overhead unfortunately remains large relative to the memory size since the depth of the decoder memories is low. Therefore, we choose to implement the randomization circuit differently compared to an ideal randomization as following.

Figure 6:
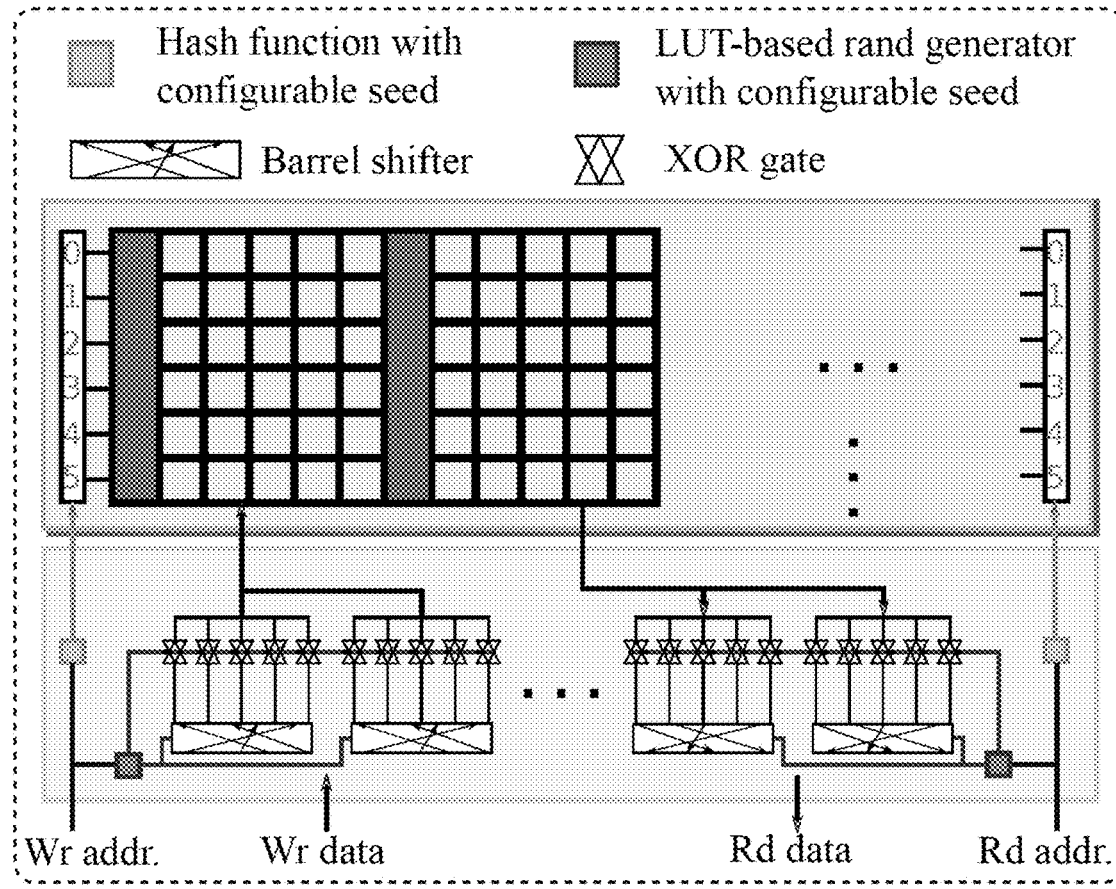
FIG. 6 shows an exemplary representation of the faulty memory macro (top) with randomization logic (bottom) that is used to create an ergodic fault process, where the randomization is applied at bit-level, LLR-level, and address-level, while the sign-bit in each LLR-word, shown with gray color, is not randomized since it is safely stored.

With respect to FIG. 1A, as an example embodiment in which the processing resource 50 correspond to the logic of an LDPC decoder, we proposed to enable the above by integrating randomization circuits that serve as routing randomizers 10, 11, 20, 21 and schedule randomizers 85 to the decoder memory macros at different granularities, i.e., bit-level, LLR-level, and address-level, as illustrated in FIG. 6. We note that a memory-word spans >80 LLRs each comprised of 6 bits. At bit-level, all the bits are XOR-ed with the same random bit to create an inversion in stuck-at errors as part of the routing randomizers 10, 11, 20, 21. At LLR-level, a barrel-shifter is used to rotate the bit orders in an LLR according to a random number as another part of the routing randomizers 10, 11, 20, 21. The random number is generated/updated with a LUT-based random number generator as counter 60 and element or device 70, where a seed is used for the initialization. Despite the simplicity and the low-complexity of the LUT-based random number generator, it has strong theoretical properties, such as universality and high independence degree, as compared to other random number generation methods [26]. Also, a similar configuration for all the shifters in each memory word is applied and no memory word-level randomization across the LLRs in a memory word is implemented to further reduce the complexity and thus the overhead. At address-level, the memory address is scrambled by a hash function that is also initialized with a seed. All the operations are applied during write and the reverse operations is applied during read to recover the original data.

A new seed is applied through a counter 70 for each codeword and is updated during each decoding iteration. The random number engine used for configuring the shifters and XOR gates receives a key from concatenation of the seed and the memory address. Beside ensuring the generation of a different random number for each memory row and thus enabling a more ergodic fault behavior, this measure provides a natural means to revert the write randomization operation during read without a need for an additional storage element to preserve random numbers during the data lifetime of the datapath memories. We note that as opposed to the random number generator, the seed of the address scrambler hash function remains unchanged during the entire decoding due to the fact that R-messages are updated over the course of iterations and thus the memory address should remain unchanged to avoid any data loss due to overwriting of valid messages.

D. Chip-Level Architecture and Operation Modes

Figure 7:
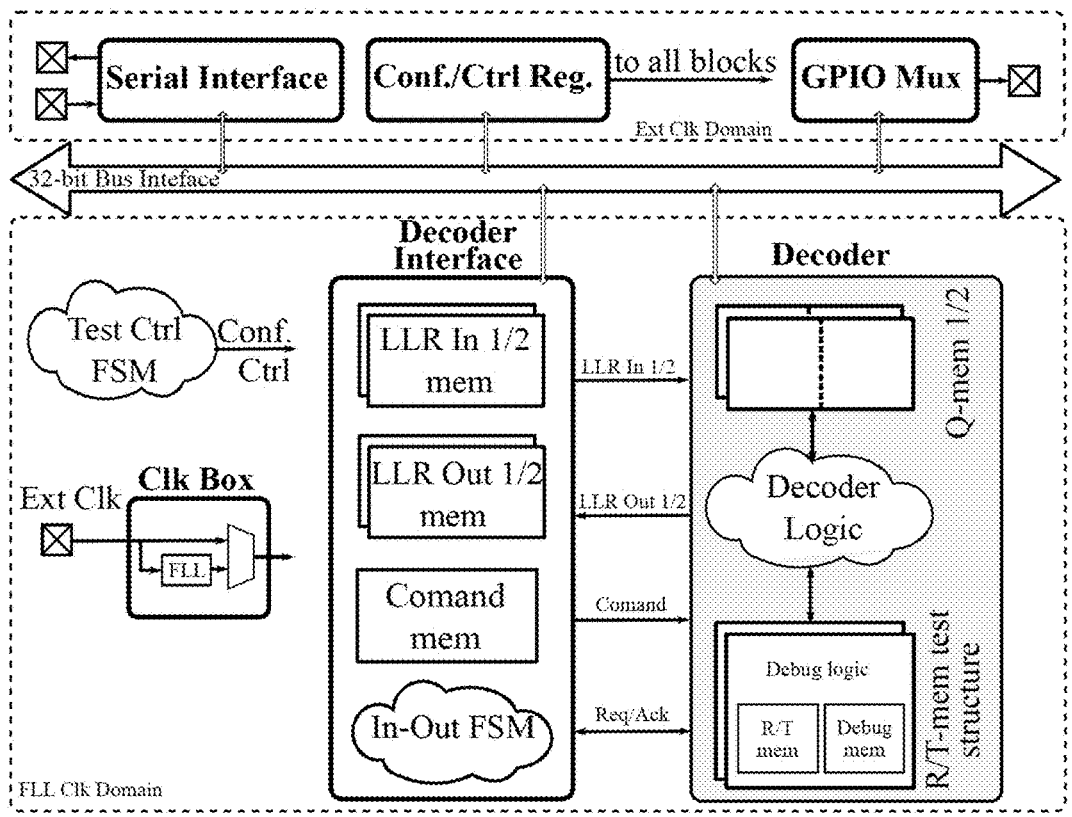
FIG. 7 shows an exemplary schematic representation of the chip-level architecture of the demonstrator chip, according to one aspect of the present invention.

An exemplary and schematic overview of the chip-level architecture is provided in FIG. 7. The architecture consist of the decoder core, interface memories for the decoder, a test controller, and a serial interface to access the memories externally, which are explained in details in the following.

The decoder main building blocks are the Q-, T-, R-memories, and the decoder logic, as previously explained.

The interface memories are comprised of two buffers for each of the input and output LLRs to store two codewords, which allow the decoder to ping-pong between two codewords in a configurable loop. Additionally, the decoder core integrates two pairs of Q-memories for continuous operation with two codewords. Once the LLR buffers are pre-loaded with channel LLRs, the decoder starts by loading its first internal pair of Q-memories. After this initial loading process, the decoder is started. During the decoding process, the second pair of Q-memories can be loaded from the interface buffer. Once the decoding of the first codeword is complete, the decoder starts to decode the second codeword and it dumps the results of the first codeword to the buffer memory and loads again the pair of Q-memories with the channel LLRs of the first codeword. Therefore, the integrated test harness around the LDPC decoder core enables continuous operation with two codewords, which is suitable for an average power measurement. It also allows a single codeword decoding by loading only one of the interface buffers and configuring the decoder for single-codeword decoding. To perform FER measurements with a larger number of different codewords, the chip interface buffers need to be loaded multiple times with fresh codewords and the results need to be checked externally by a test setup.

A serial interface provides access to all the storage elements of the chip, i.e., test structures and interface memories as well as configuration registers, as in FIG. 7. While this serial interface requires only few pins, it is also slow and therefore data can neither be provided nor be checked in real-time from outside the chip. Instead, it is used to load the stimuli and the configuration into the corresponding storage elements, trigger the decoder, and read out the result. It is worth noting that a parallel-to-serial and a serial-to-parallel shift registers are integrated to enable reading from/writing to the memory macros with the wide word length.

The chip provides multiple operating modes. While a free running mode over repeated codewords is used to measure an average power, multiple runs of the decoder over different codewords is used to measure the FER or memory fault maps by reading the corresponding memories. Further, the test structure around T- and R-memories can be used to record faults in any phase of the decoding process or can log aggregated fault maps over the entire decoding of a codeword. The randomization scheme to generate an ergodic behavior can be activated or deactivated.

VI. Test Chip & Measurement Results

Figure 8A:
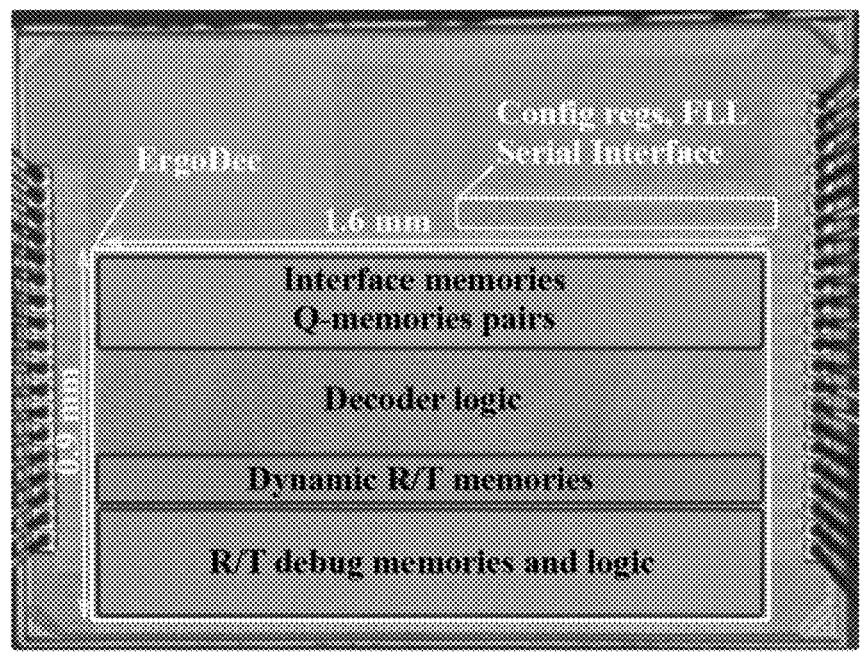
FIG. 8A shows a view of the chip micrograph and FIG. 8B shows a table with data on some of the main features of the chip.

The chip architecture, described in Section V, was fabricated as an exemplary and non-limiting design in a 28 nm FD-SOI regular-$V_T$ CMOS technology, utilizing 1.44 mm$^2$ of a complete 3 mm$^2$ die. The micrograph and main features of the chip are shown in FIG. 8. In addition to the area, we report the reliable frequency ranges and the corresponding power consumptions for two supply voltages. The minimum reliable frequency is the lowest frequency with no memory error (no DRT violation) and the maximum reliable frequency is the highest frequency that the decoder can achieve without setup-timing violation.

A measurement setup is developed for the chip that reads the measurement stimuli and configuration data for different test scenarios from a computer, writes them to the chip and reads the output results from the chip back to the computer through a serial interface using an FPGA. The chip operation clock during each test is generated on-chip using an embedded frequency locked loop (FLL), which provides the flexibility to explore the reliability (i.e., retention time limit) of the embedded memories.

A. Comparison with Prior-Art Implementations

Figures 10, 11, 12:
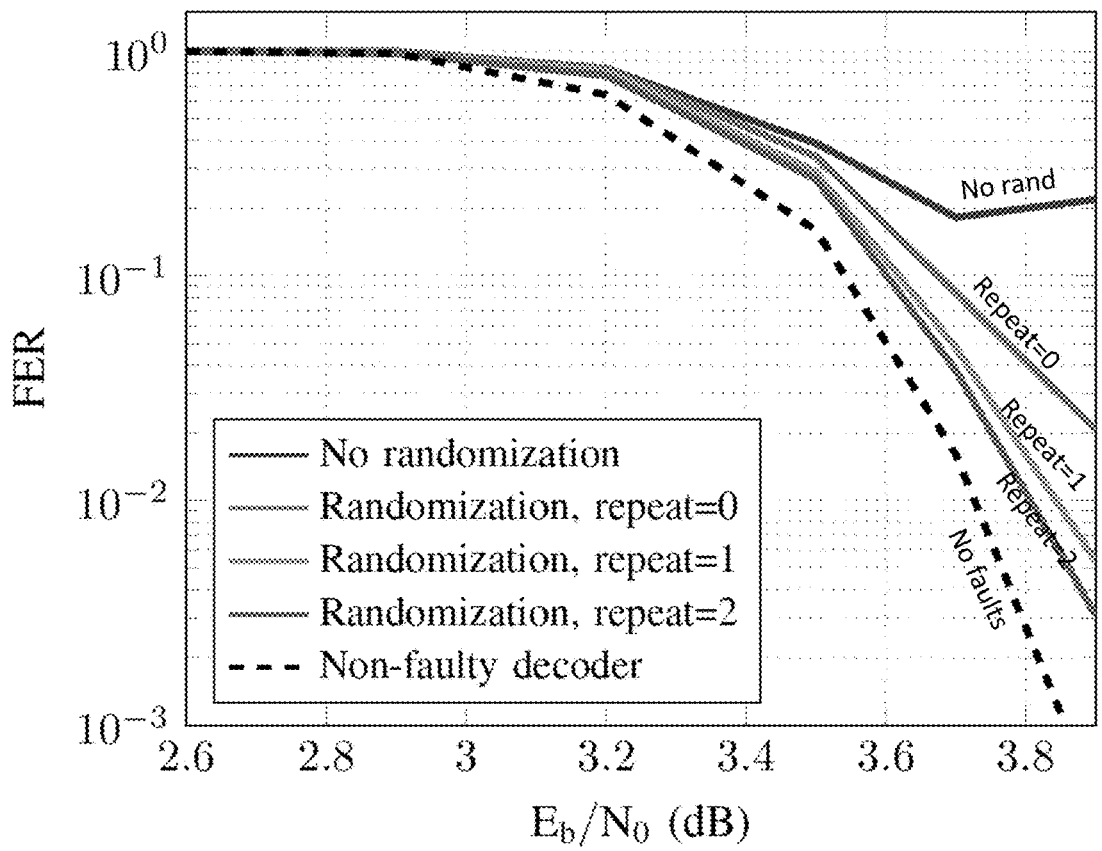
FIG. 10 shows graphs representing the measured frame error rate results of a faulty LDPC decoder chip with R-memory (T-memory) fault probability of $P_b \approx 5\times10^{-4}$ ($Pb \approx 2.5\times10^{-4}$) while the unsuccessful decoding are repeated for 1 of 2 times.
FIG. 11 shows a table representing data lifetime in the T- and R-memories for the considered QC-LDPC code with N=15 and M=3.
FIG. 12 shows a table with comparative data of the different QC-LDPC decoder chips.
Figure 13:
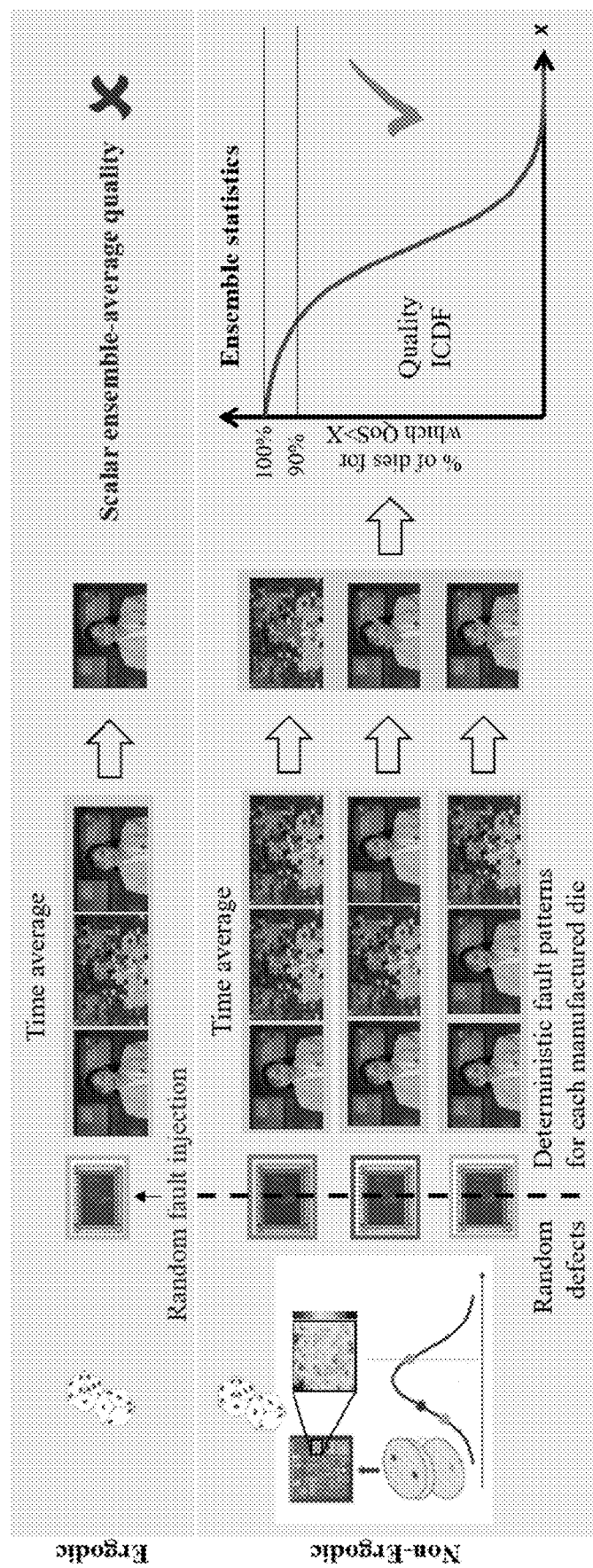
FIG. 13 shows an exemplary schematic representation of invalid, ergodic fault model with random stationary fault injection and ergodic (time/data and ensemble-average) quality on the top, and on the bottom: analysis of the quality-yield tradeoff for a population of dies with specific failure modes and corresponding non-ergodic fault process.

The table of FIG. 12 provides a comparison between the QC-LDPC decoder chips presented in literature by summarizing their main features. Among these works, our proposed decoder, the decoder in [22], and in [13] use a dynamic SCMs while the rest use static memories for their data-path memories. The proposed decoder provides an 843 Mbps throughput while it consumes 9.2 pJ energy per bit in a decoding iteration. Even though our chip does not provide the best throughput and energy efficiency in comparison to prior QC-LDPC decoder chips in literature, as it is a test chip that is heavily instrumented with debug memories and logic gates to track the memory faults, it is the first approximate decoder that provides effective approaches to mitigate the memory faults. Additionally, it shows an ergodic fault behavior and a stable performance across a population dies, which are discussed in details with further measurements.

C. Decoder Performance

According to one aspect, the ergodic fault model does not reflect the reality of the manufactured dies and indeed there is a distinction between the quality of different dies. To confirm the non-ergodic assumption, we need to consider the ultimate decoder performance, i.e., the FER, as it was shown in the simulation results in Section IV. To this end, we measure the FER of the decoder chips on 17 different dies from two (typical and slow) fabricated wafers to better extract the statistics. In order to have comparable results among all the dies, we first calibrate the operating frequency such that each test die yields the same number of errors (same $P_b$) in their memories, while the difference between dies only lie in the fault locations and characteristics. We then measure the FER by reading the decoded codewords from the output LLR interface buffer and compare them against the expected (reference) result for different codewords.

We have also proposed to randomize the memory errors to restore the pre-manufacturing ergodic behavior across the population of manufactured dies. To show the improvement made by the proposed randomization technique, we run the FER measurement with two different configurations. The first configuration relates to the normal operation of the decoder, without the randomization device, while the second one corresponds to the case where the randomization circuits are enabled. To this end, the data is XOR-ed with a random number, the LLR bits are shuffled, and the address is scrambled for the T-memories as in FIG. 6, however, XOR gates are disabled for the R-memories to benefit from the skewed fault pattern and the strong logic-0 bias of the data in the R-memories.

Figures 8B, 9A:
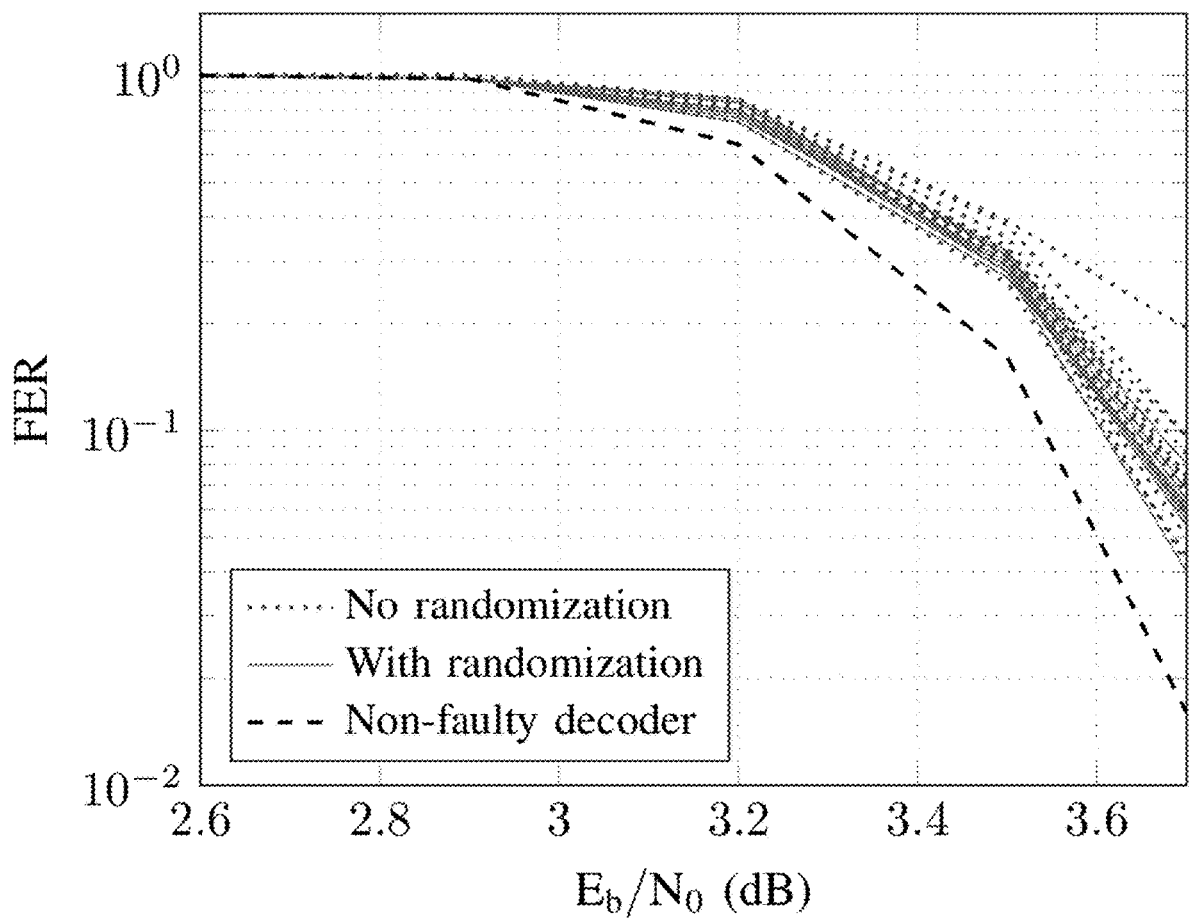
FIGS. 9A and 9B show graphs representing the measured frame error rate results of seventeen (17) faulty LDPC decoder chips with R-memory (T-memory) fault ratio probability of $P_b \approx 5\times10^{-4}$ ($Pb \approx 2.5\times10^{-4}$), with FIG. 14A showing FER vs. $E_b/N_0$, and FIG. 14B showing the empirical cumulative density function of FER at a fixed $E_b/N_0$.
Figure 9B:
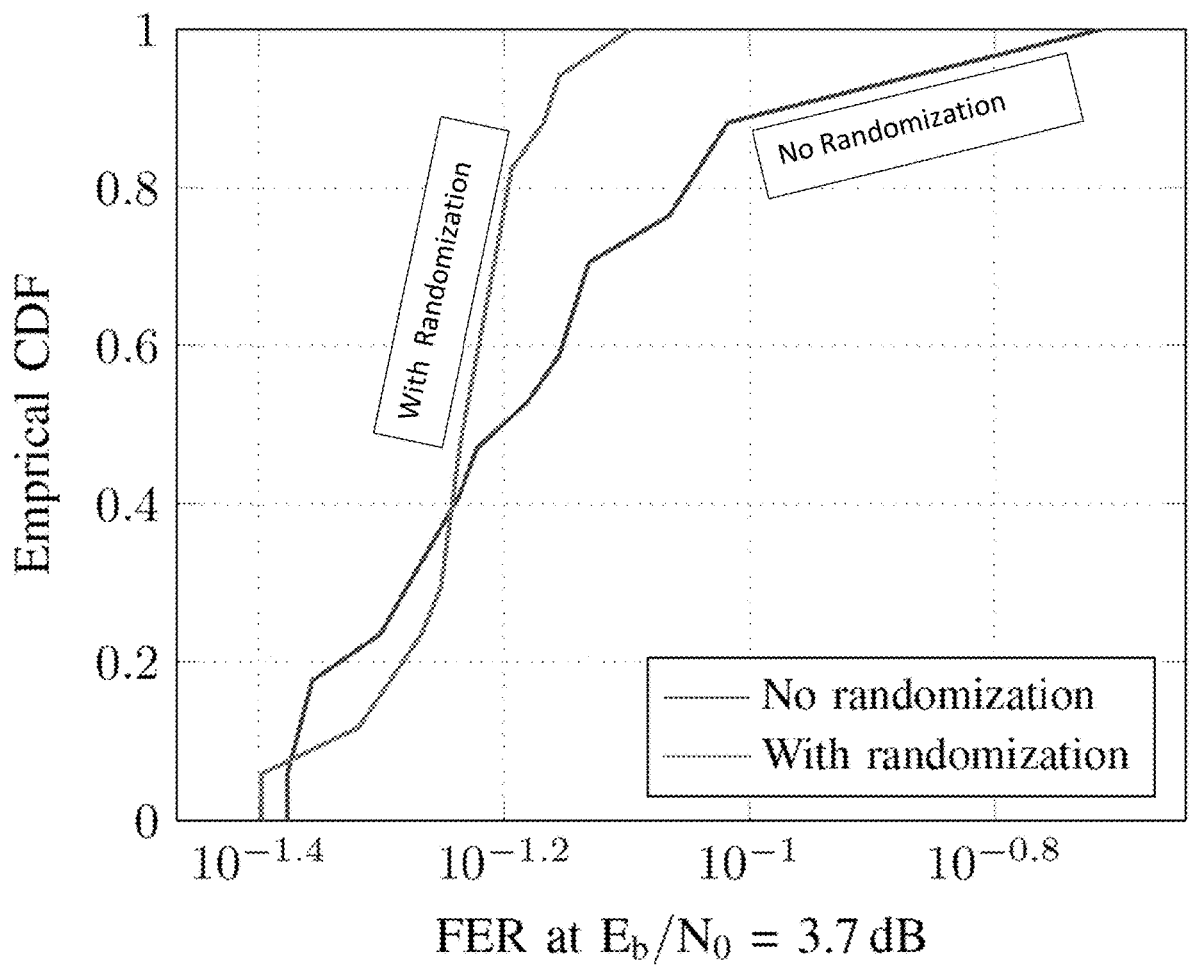

FIGS. 9A and 9B show the FER measurement results vs. SNR and the empirical CDF for the dies at a fixed SNR of 3.7 dB for a fault ratio of ($P_b$=2.5×10$^{-4}$ ($P_b$=5×10$^{-4}$) in T-memory R-memory), respectively. The dotted curves pertain to the normal operation mode of the decoder and the dashed black curve corresponds to the non-faulty decoder from the simulation model. We can see clearly in FIGS. 9A and 9B how the FER performance across SNR is different for different dies, despite the calibration for the same number of errors. We also see the spreed among the dies in the CDF of FER at one SNR. This observation proves the non-ergodic behavior of the quality and thus the decoder performance across the population of decoder dies, as predicted by the simulation results in Section III.

The light grey solid lines in FIG. 9A pertain to the case where the randomization circuits are enabled while each die is running at the same calibrated frequency similar to the above. As we can clearly observe, the quality spread is reduced by employing our randomization technique. This smaller quality variance among the dies indicates that the quality becomes almost ergodic. Therefore, the time-average quality of each die approximates the ensemble-average quality of the population of dies, as we have also observed in Section IV. In addition to the improved quality across the population of dies, this stabilization now enables an extremely easier testing procedure for a target minimum quality. To this end, dies need only be sorted by the fault ratio in the memory and a minimum quality for all the dies in each group can be guaranteed as they now have a similar time-average quality.

Along with the randomization technique, we have also proposed to repeat the decoding for the unsuccessful codewords by introducing a schedule randomizer 85 from FIG. 1 that repeats the known schedule with different seeds when decoding is unsuccessful with a different fault realization achieved through a different corresponding hash value fed to the routing randomizers 11, 12, 20, 21, which showed a significant performance improvement in simulations. To verify this proposition, we run a measurement on the measured die that showed the worst error rate performance without randomization among all the measured dies. We allow up to two more decoding repetitions for the unsuccessful codewords, while in each repetition we initialize the random number generator and the hash function with a different seed (see FIG. 6) to ensure an independent behavior for the logical memory faults. During the post processing, we consider the codeword as correctly decoded if any of the corresponding decoding attempts were successful. We show the FER vs. SNR for this example chip in FIG. 10. As we can observe, the FER improves as we enable repeating the decoding of unsuccessful codewords compared to the case with no repetition and to the case without randomization. This improvement is significant specially for the curve with two (2) extra repetitions, colored in pink, such that the performance of the faulty decoder approaches that of the non-faulty decoder, colored in black. This observation proves the efficacy of our proposition in Section IV, and shows a methodology to improve the faulty decoder performance at a negligible overhead while this improvement can only be enabled with the proposed randomization scheme.

While the above explanations show the application of the proposed randomization method and device applied to an LDPC decoder, we note that the method is generic and applies to any device, system, or logic accessing a memory that may include none, one, or multiple faults. In the following, we explain in a similar manner the application to an embedded system as a further example of the application of the method.

According to some aspects of the present invention, a method, system, and device is proposed to deliver reliable performance guarantees for integrated circuits that suffer from manufacturing reliability issues in embedded memories. This methodology is based on a design-for-test procedure that guarantees identical time-average behavior for all manufactured dies with the same number of defects by restoring the beauty of randomness, for example an ergodic behavior. The methodology enables a quality-yield analysis and a simple, low-overhead test strategy that does not require costly per-die quality assessment. More specifically, we propose to use the quality-yield tradeoff (i.e., the time-average quality distribution in the entire population of dies) instead of the ensemble-average quality to assess the fault-tolerance of applications and architectures. This approach provides clarity on how many dies meet a given quality requirement. We propose a new design-for-test strategy that randomizes the deterministic post-fabrication errors to justify an ergodic fault model and to ensure the same quality for many dies that are easy to identify. This measure is a preferable aspect for a manageable test procedure. We demonstrate and evaluate our methodology with practical image processing benchmarks for an embedded system with faulty memories.

Next the application quality is assessed based on unreliable memories. A common approach to analyze the robustness of applications against reliability issues is to randomly inject errors during simulations and to obtain an average quality across many simulation runs (i.e., for different error patterns), to simulate unreliable memories. Both, the convenience and the issue of this model lies in the fact that it does not distinguish between the behavior of a given die over different inputs (i.e., time) and the behavior across a population of dies. This lack of distinction between these two dimensions corresponds to an ergodic fault model in which the impact of manufacturing defects and faults that appear randomly over time is the same. More formally, let $$\mathcal{P}_{(y, e_n(y))}$$

be the quality of the output of a given die n being an element of N, where N denotes the population of dies created by the manufacturing process. The specific fault realization for the test-data y and the die n is described by the random process $e_n(y)$. The time-average quality of a given die n as observed during operation of that die $$\bar{\mathcal{P}} = \mathbb{E}_{y|n}[\mathcal{P}_n(y, e_n(y))]$$

is the quality metric that we must ultimately guarantee for each chip that passes the production test. Since evaluating the distribution of $P_n$ for a large population of dies is tedious, it is common practice to assume independence of errors from the data/time $$(i.e, e_n(y) \to e_n)$$

and to consider only $$\bar{\mathcal{P}} = \mathbb{E}_{y,n}[\mathcal{P}_{(y,e_n)}]$$

Figure 14B:
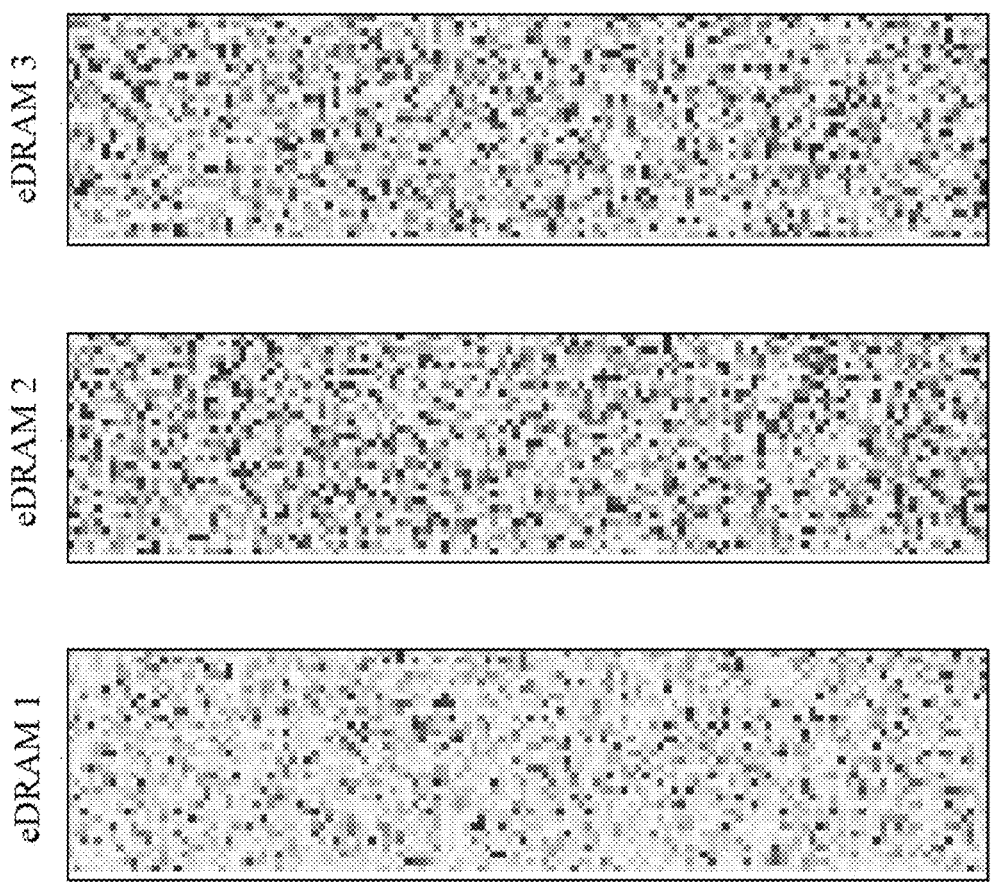
FIGS. 14A and 14B show different exemplary measurements showing the impact of different manufacturing outcomes for different chips, with FIG. 14A showing a fault-map of three SRAM macros and corresponding failure rate in time for the bits across multiple tests, and FIG. 14B showing data retention time maps of three Gain-Cell eDRAM macros.
Figure 14A:
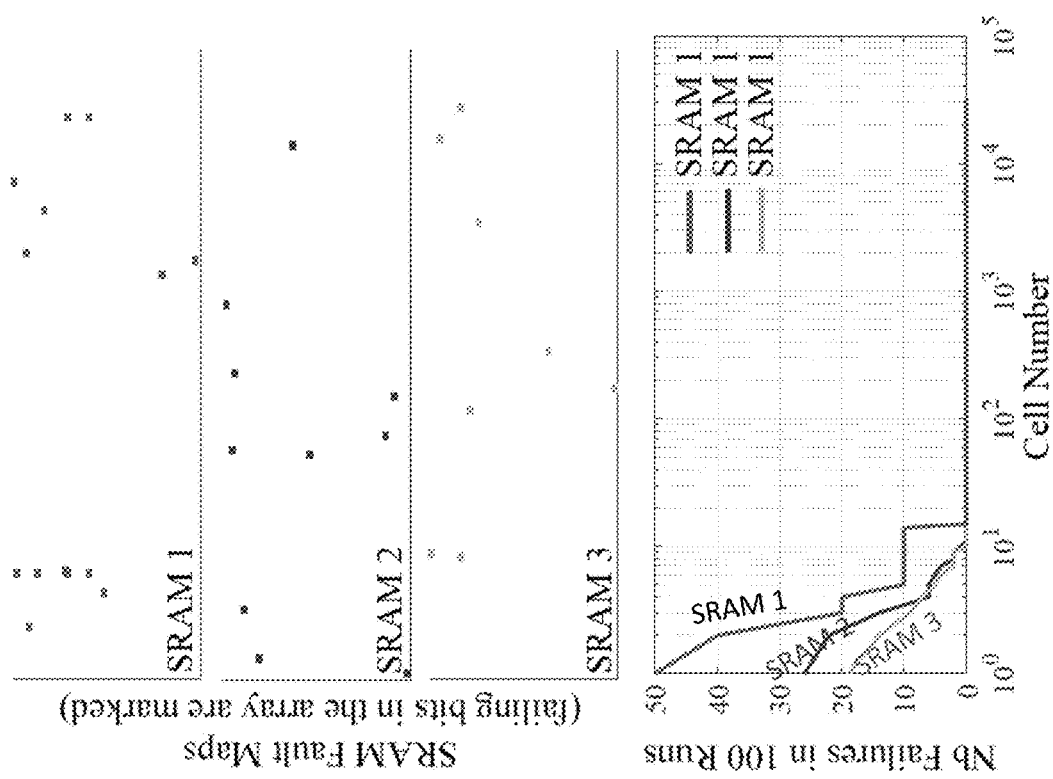

This simplification allows random fault injection which yields a significant complexity reduction in the experimental evaluation. Unfortunately, the quality of each die is not an ergodic process Therefore, $$\bar{\mathcal{P}}_n = \mathbb{E}_{y|n}[\mathcal{P}_n(y, e_n(y))] \neq \bar{\mathcal{P}} = \mathbb{E}_{y,n}[\mathcal{P}(y, e_n)].$$
$$\uparrow \qquad\qquad \uparrow$$
per–die     ensemble–average
average quality    quality With respect to an ergodic vs. a non-ergodic fault model, the reason why the ergodic fault model is flawed is that the impact of process variations is mostly deterministic after manufacturing, but different for different dies. This claim is indirectly supported by various publications that show measurements for different chip instances and is even exploited for example for physically unclonable functions (PUFs). While the objective of this paper is not to prove this non-ergodic behavior, but to focus on its impact, we still illustrate this nonergodic fault process for memories with two examples: For SRAM, within-die process variations determine the unstable bits that fail at low voltages. In FIG. 14A we show measured fault maps of the same SRAM on three different dies at a 0.6V supply voltage. The different fault locations between the dies are clearly visible. FIG. 14A also shows the failure probability of each bit on each die in repeated experiments. The failure probability of the faulty bits over time is high compared to the percentage of faulty bits, which discourages a model with random fault injection at the bit-failure rate. For DRAM and embedded DRAM, variations determine the retention time of each individual bit in the memory. Without a pessimistic refresh, weak cells are the first to fail. FIG. 14B shows the differences in the retention time distribution of an eDRAM for three different dies. It is clearly visible how the bits with an inferior retention time are in very different locations across dies. For a critical refresh interval, this leads to different, but stable (over time) error patterns for each die.

To appreciate the impact of this non-ergodic behavior on the relevance of a quality assessment based on an ergodic fault model, consider the following simple example: A measurement vector y of length T is stored in an unreliable memory using B-bit 2s-complement format. Our quality metric is the mean-squared error of $\hat{y}_n$ which is the data affected by errors in the memory of the n th die compared to the original data. A first issue which already illustrates the problem of the ergodic fault model is that for a given bit-failure probability each manufactured die is affected by a different number of errors according to a binomial distribution. However, even for those dies that have the same number of errors K, we observe significant differences in the quality. With an independent and identically distributed (i.i.d.) ergodic fault model in which K errors manifest as random bit-flips, the ensemble-average error is convenient to determine analytically as $$\mathbb{E}_n[|y - \hat{y}_n|^2] \approx \frac{K}{TB}\sum_{b=0}^{B-1} 2^{2b}$$

Unfortunately, it is easy to show that for an arbitrary die we can only guarantee that $$\frac{K}{T} \leq |y - \hat{y}_n|^2 \leq \frac{K}{T}2^{2(B-1)}$$

These far-apart bounds correspond to bit flips either all in LSBs or all in MSBs representing the best-case and the worst-case scenarios. One is significantly better, the other significantly worse than the ensemble-average predicted by the ergodic model.

With respect to the assessment of the quality-yield trade-off for non-nrgodic fault models, from the discussion above, it is evident that the ergodic fault model and therefore the assessment of the ensemble-average quality for a system with unreliable (memory) components is meaningless. In fact, even for a very good ensemble-averagequality, a significant percentage of dies may fail to reach a decent minimum-quality target.

A meaningful assessment of the impact of reliability issues must therefore provide a quality-yield analysis. This analysis generates a population of dies N with their individual fault patterns. The cumulative density function (CDF) of the time-average quality then indicates the quality-yield, i.e., the percentage of dies that achieve a given minimum time-average quality target. The procedure to obtain the quality-yield is as follows:

1) First, the manufactured dies are grouped by the effective error ratio, defined by the number of faulty bits relative to the memory size. Since for a given bit-failure probability the distribution of the number of errors is a very peaky (Bernoulli), we consider here only the most prominent group in which the error ratio is equal to the bit-failure probability, but all other groups are straightforward to include as well.

2) For a given number of errors, we generate a population of dies n being an element of N with their individual fault types and locations en. These faults are different deterministic realizations of the fault model, which can be obtained based on silicon measurement statistics. Correlated faults can easily be included at this point.

3) Using benchmark system simulations with targeted fault injection according to $e_n$, the time-average quality is obtained for each die in the population with two nested simulation loops. While the outer loop iterates over the different dies n being an element of N, the inner loop iterates over the input data y (i.e., over time) to evaluate the time-average quality $$\bar{\mathcal{P}}_n = \mathbb{E}_y[\mathcal{P}_n(y,e_n)]$$

4) The final analysis yields the CDF of all the measured qualities Pn. This CDF illustrates the quality of the population of dies and therefore provides the complete information for yield assessment.

To demonstrate the quality-yield assessment, a software-programmable embedded-system based on the PULP platform was used with faulty memories. The memory subsystem includes of both 1024 KB reliable and 512 KB unreliable (i.e. faulty) memories. In a regular system, the reliable memory would be significantly smaller to leverage energy savings, but it is kept large in our test setup for convenience since this article does not focus on quantifying potential energy savings. The former contains all the program code as well as the critical, e.g., control, data of the selected benchmarks while the latter is used to outsource less-significant large working sets of the benchmarks. The system is implemented on a XILINX FPGA. To emulate the faulty-SRAM on the FPGA we integrate a fault-memory emulator to emulate SRAMs with die-specific fault patterns. Different embedded benchmarks are implemented in C. For each benchmark, a short description and the considered quality metric are reported in the table of FIG. 16. After programming the FPGA, the evaluation process runs autonomously on the CPU of the emulated embedded system. Specifically, we derive 300 different fault maps according to a simple process fault-model that includes stuck-at-0 and stuck-at-1 faults. Each fault map corresponds to a chip, and we derive the quality for each chip through simulations. Finally, the assessments across all fault maps (i.e., all simulated chips) leads to the quality-yield trade-off as shown by the CDF of the time-average quality.

Figure 15:
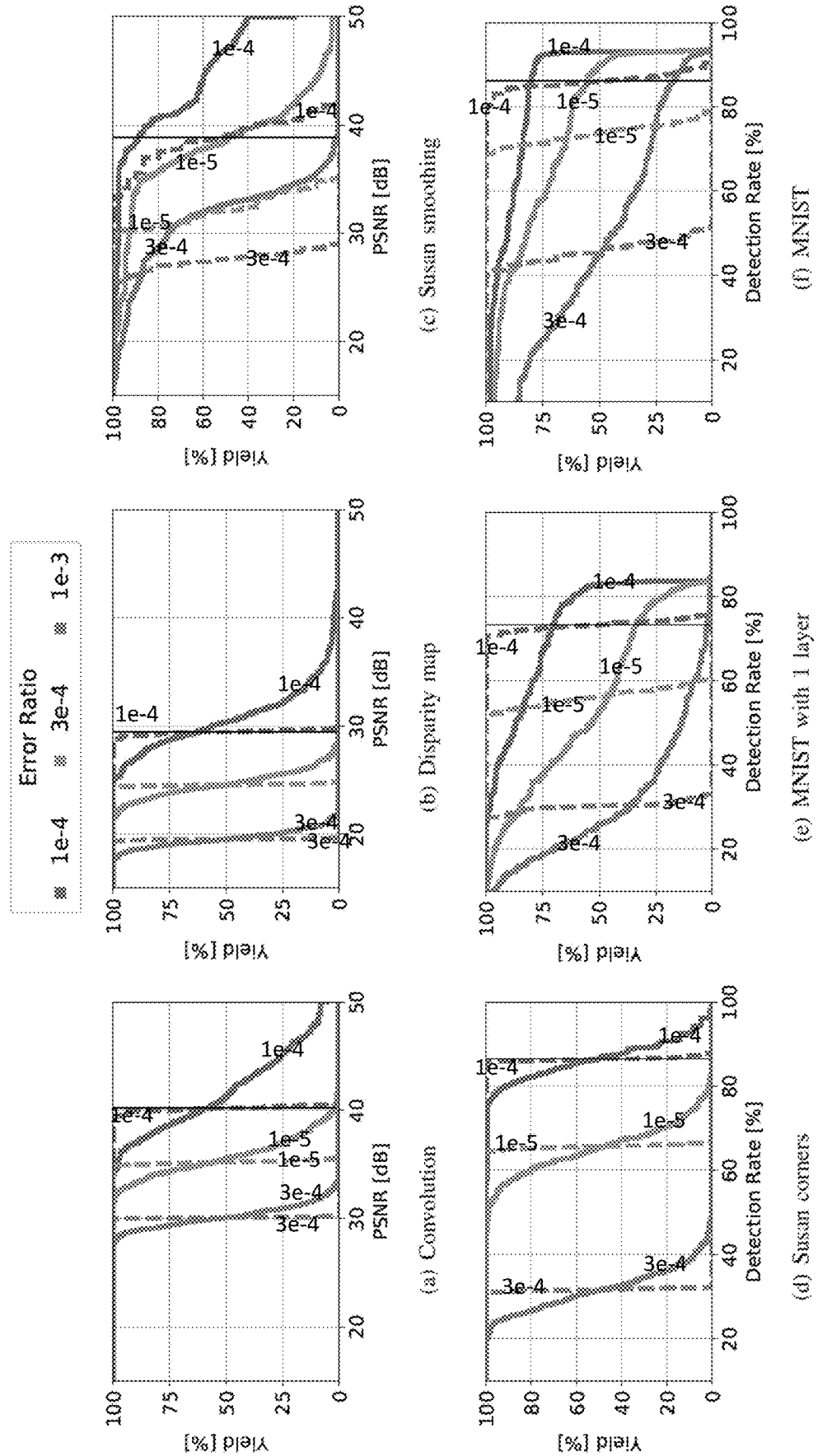
FIG. 15 shows different graphs for a benchmark quality-yield trade-off analysis for a non-ergodic fault process with four different error ratios without (solid lines) and with (dashed lines) randomization of the logical to the physical address space mapping for multiple executions of the benchmarks. The black line shows the ensemble-average quality corresponding to an ergodic fault model for error ratio of $1\times10^{-4}$.

With respect to quality-yield results, the solid lines in FIG. 15 show the quality-yield tradeoff for different fault ratios (i.e., percentage of defect bits, corresponding for example to different supply voltages). Each benchmark is repeated multiple times with varying input data. We observe that even for a given fault ratio, the quality spread across dies is very large due to the very diverse impact of the different die-specific fault patterns. For example, for the disparity benchmark different chips with the same fault ratio of $10^{-4}$ span a quality range of 25 dB to 42 dB, while the ergodic average quality across all chips, shown with a dashed line, is 31 dB. Some chips provide significantly better quality than the average, while others deliver a significantly degraded quality. In fact, a minimum quality requirement equal to this average of 31 dB only provides a yield of around 40%.

With respect to the restoration of the ergodic quality behaviour, the quality-yield analysis allows to choose a design point that optimizes power and other cost metrics under a given minimum quality and yield target. Considering the worst-case as quality target obtained from extensive simulations of a large population of dies would allow to deliver all manufactured chips, i.e., 100% yield, without further testing. Unfortunately, we have also seen that the quality spread across different dies can be very large and the worst-case quality in a population of dies can be very low. Hence, the worst-case quality is not an attractive target since a much better quality can be guaranteed with only a small yield-loss.

Testing can be done for a defining a minimum quality requirement. The difficulty in targeting a specific minimum quality requirement that is better than a pessimistic worst-case quality lies in the need for a parametric test procedure. Such a procedure must be able to identify the quality level for each manufactured die to compare it to the quality threshold to decide if a die should be discarded. Unfortunately, efficiently obtaining the quality level provided by a specific die with a faulty behavior is extremely difficult.

A straightforward approach would be to simply run a quality benchmark on each die similar to the design-time quality-yield analysis. However, such tests require excessive test time and are therefore uneconomic. An alternative method would be to simply keep a pre-computed table of all the potential fault patterns together with the information on the resulting quality. However, the number of potential fault patterns explodes with the memory size. For example, for a maximum of 5 errors in 1 Kbit of memory, there are already more than 1012 possible fault patterns which is already prohibitive. We therefore conclude that identifying the time-average quality of a specific faulty die (with a given and fixed fault pattern) during test is economically difficult if not impossible to implement.

The proposed design-for-test strategy is to restore the beauty of randomness. The solution to the above-described testability dilemma lies in the observation that the issue is that the error pattern of each individual die is deterministic. Hence, a straightforward average over multiple different error patterns (i.e.,_ P) is without further measures not representative for the quality of a given die. To alleviate this issue, we propose to modify the design in such a way that even for a given die (with fixed fault pattern) the time-average across the data corresponds to the ensemble-average over the entire population of dies. Specifically, we propose to randomize the errors caused by a given fault pattern over multiple executions of the same benchmark kernel (even with the same data). This measure restores the beauty of an erogdic fault process for which the quality delivered by each die is the same as the average-quality over a population of dies.

Next, the restoring of the ergodic behaviour with faulty memories is explained. In order to realize a random behavior for a faulty memory, fault locations must be moved post-manufacturing across the memory array. Additionally, fault types should also be altered randomly to provide a time-varying polarity for stuck-at-0/1 faults. To achieve this randomization, we distinguish between the physical XY-location of a bit in a 2D array of bit-cells on the chip and the logical address including the index of a bit in a word. For the program, only the logical address is relevant, while defects after manufacturing are fixed to physical locations. Most systems employ a direct, fixed mapping between logical addresses and physical XY-locations that does not change over time. However, any uniquely reversible mapping is valid and the mapping can be changed any time the program is restarted and the data in the memory is re-loaded. When the mapping changes, also the location of defects in the logical address space changes as illustrated in FIG. 17.

With respect to an exemplary logic circuit that is configured to randomize the memory access operation from a processing resource 50 of the physical memory space, for example the memory ressources 40 of FIG. 1A, or the simplified schematic representation of FIG. 1B, the logic circuit, for example a randomization logic that can corresponding to the schedule randomizer 85 and the routing randomizer 10, 20, 11, 21 that are shown in FIG. 1A, providing for a randomizes access, this can be done by different implementations.

Figures 18, 19:
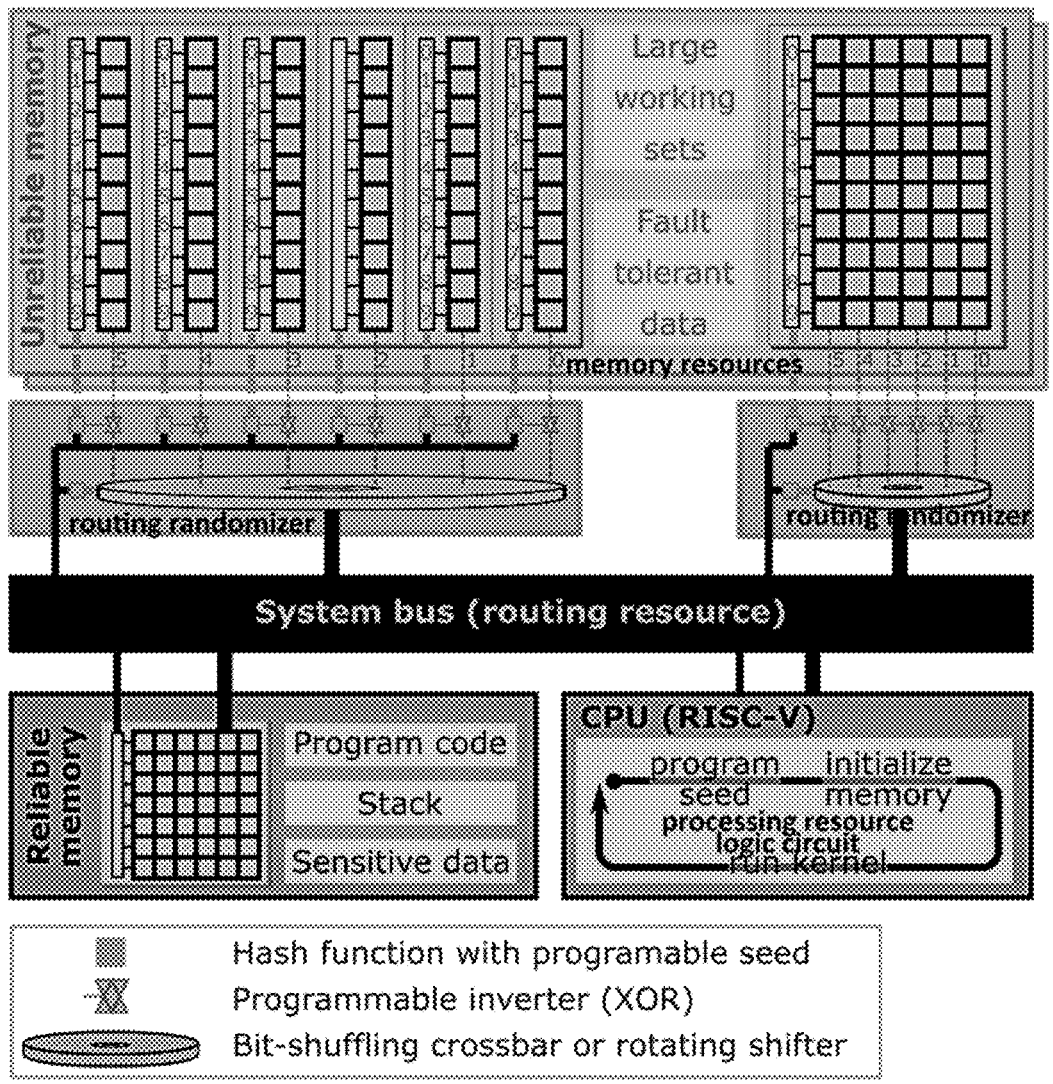
FIG. 18 shows an exemplary system diagram with unreliable memory (top) and logic for ideal (top-left) and simplified (top-right) randomization.
FIG. 19 shows a table showing the surface area overhead in percentage of the overall chip surface of the randomization logic on memories with different sizes.

For example, it would be possible to provide for an ideal randomization logic with the logic circuit as routing randomizers 10, 20, 11, 21. To implement an ideal randomized mapping, in which each logical bit can be placed in each physical XY-location, one or more memory areas of memory resource 40 can be broken up into 1-bit wide sub-macros which are all individually addressable. A schematic representation of such a memory configuration for memory resource 40 is shown on the top-left in the exemplary system diagram in FIG. 18. In this FIG. 18, the CPU is part of the processing resources 50 and the system bus is part of the routers 30, 31. The randomization of the routing randomizers 10, 20, 11, 21 can be controlled by pseudo-random seeds S that are changed before each kernel execution, for example with hash element 70 and counter 60 as exemplarily illustrated in FIG. 1A, and can be implemente as a hardware circuit or a software algorithm, or a combination of both. With this ranom seed S, hash functions of hash element or device 70 can derive scrambled addresses for each sub-macro from the same logical address of a memory space of memory resource 40. This operation therby can merge an opertion of the schedule randomizer 85 and the hash element or device 70. Routing randomizers 10, 20, 11, 21 can take the function of a crossbar, controlled by a hashed address from hash element or device 70, configured to permute the order of the bits in a word on the data bus of circuit 200. The data bits are further XORed in routing randomizers 10, 20, 11, 21 with pseudo-random bits derived from the address and a random seed. This reversible logic operation of the logic device randomizes stuck-at polarities in the logical data. Performing the same operations with the same random seeds until a new independent kernel execution for all read- and write-operations ensures transparency of all above described mappings.

As of another example, it would be possible to provide for a simplified randomization logic, for example a pseudorandom logic, with schedule randomizer 85 and the routing randomizers 10, 20, 11, 21 as the logic device. Because the ideal randomization can be very costly, mainly due to the overhead for the breakup of the memory into 1-bit wide sub-macros, a simplified randomizion logic may be preferable. Therefore, a reduced-complexity randomization scheme with the logic device is proposed, which leaves memory macros of the memory resources 40 (STORAGE ARRAY) untouched, requires fewer hash function gates at hash element or device 70, and avoids a full crossbar in at the routing randomizers 10, 20, 11, 21. The corresponding schematic is shown for the top-right memory in FIG. 18. A single hash function randomizes the address, the data bits are shuffled in the ROUTING RANDOMIZER with a cyclic shift within a word, and all bits of a word are either inverted or not depending on the hashed address.

In addition, the logic circuic for the randomized access of memory space can be implemented in different ways, for example by the use of software which assigns a different base address to certain parts of the data for every COUNTER value, With dynamic systems, the operating system can also be altered to take the role of a RANDOMIZER, assigning variable resources (processing or data) deliberately differently for different COUNTER values. The randomization can also be implemented in a processor with multiple identical processing resources to assign these resources deliberately different for different (otherwise possibly identical) program or kernel executions. As a further alternative, any form of programmable logic (e.g., of an FPGA module) can be leveraged to implement a randomized routing or schedule as long as the program outcome on a fault free hardware is 100% identical. In general it is beneficial to design the randomization in such a way that the impact of likely errors is minimized, but this is not required for the invention itself.

With respect to the results achieved and the test procedure, we analyze the impact of the proposed randomization logic on the quality-yield, we describe the straightforward test procedure, and we analyze the area overhead. With respect to the impact on quality-yield trade-off, we re-evaluate the quality-yield for the benchmarks in the table shown in FIG. 19 using the proposed simplified randomization circuit. For a given fault ratio, a different fault map is still generated for each die. However, we now re-program the seed of the address space randomization logic with a different value for each repetition of a benchmark. The average quality across these repetitions with different seeds, but with the same fault map (i.e., on the same die) is now the basis for the quality-yield assessment. This analysis reflects the distribution of the average quality that is delivered by the individual dies when operating over an extended time period (e.g., the frames of a video). The results of this analysis are shown by the dashed-curves of FIG. 15 for different fault or error ratios. We observe that quality across individual dies shows only a very small variance. Considering the Disparity benchmark again as an example, different chips with error ratio=$1\times10^{-4}$ in the memory provide a quality variance of only 2 dB around the median quality of 29 dB. This negligible spread indicates that the average quality across multiple benchmark executions on the same die now matches the ensemble-average quality of the entire population of dies. However, while this new stability improves the quality for 50% of the dies, it also degrades the quality of the other 50% in the population. Nevertheless, it avoids the outliers with very poor quality.

With the test procedure, it has been shown that the main advantage of the randomization lies in the impact on the required test procedure. Since each die with the same number of faults now provides the same quality, no parametric quality test is required. Instead, we can only filter the dies with a too high number of faults and still guarantee the same average quality for all remaining dies. This tremendously simplifies the test procedure without significant quality margins or variations as the critical poor-quality outliers have been eliminated.

With respect to the impact on hardware complexity, in order to evaluate the hardware overhead of the proposed randomization logic, in an exemplary test embodiment, we integrated the randomization circuit for 32-bit wide SRAM blocks with different capacities. Area results after synthesis for a 28 nm fully depleted silicon on insulator (FD-SOI) technology are reported in the table shown in FIG. 19. As the memory size increases, the randomization logic remain almost unchanged. We see that the area overhead becomes already substantially negligible for small memories of only 8 KBytes-16 KBytes.

To briefly summarize, with the herein presented method, device, and system, a memory management is presented for faulty memories based on an ergodic fault process. Memories dominate the area and are the point-of-first failure in my SoCs in advanced nano-meter nodes. Since the design of 100% reliable memories is costly, it is interesting to consider dropping the requirement of 100% reliable operation. Unfortunately, deviations from a conservative design paradigm lead to deterministic quality-differences between manufactured dies that are difficult to catch in a manageable production test. We show how the test issue can be avoided with simple additional circuits that restore the beauty of random faults that change over time independently of the manufacturing outcome (i.e., an ergodic fault process) to equalize the quality across dies. A complex parametric quality-test procedure is therefore no longer required even with unreliable memories.

The herein presented decoder device, and the method of operation of the decoder device, and system including the decoder device can solve many of the issues described in the background section, as today any chip that does not 100% match the golden model (i.e., is at risk of any potential error) must be discarded because a large quality spread among those chips exists and the ones with sufficient quality cannot be distinguished from those with insufficient quality.

The herein presented memory decoder device, and the method of operation of the memory decoder device, it is possible to reduce the quality/performance spread of chips that are not 100% reliable. It also improves the quality/performance of those chips affected by errors that would normally show a quality/performance on the low side of the spread. This reduction of the quality/performance spread across many different failure modes ensures that a large number of chips with reliability issues now provide either the exact same or approximately the same average quality/performance over a period of time. These chips that belong to the same quality-group can also easily be identified during test, based on the herein presented method of operating the chip. Only those few that belong to a group with insufficient quality must be discarded, while others can be retained. We note that in general the herein presented method, device, or system for memories does not only reduce the quality/performance spread within a group, but reduces also the global quality/performance spread, which increases the number of chips that belong to a group with at least sufficient quality/performance. As an important feature, it is typically easy to define those groups with different qualities using simple and straightforward test criteria that are already derived during standard test procedures or can easily be derived with minimum additional test overhead.

From the perspective of a chip manufacturer, this innovation has several immediate benefits:

Chips which do not 100% match the golden model (e.g., due to defects or parametric variations in the manufacturing or due to worst-case operating conditions at run time) are only discarded if those issues can not meet quality/performance requirements. Those chips that do still meet these requirements are retained, which increases yield. The required test procedure is compatible with state-of-the-art industry testing requirements.

The ability to not discard all chips that deviate even slightly from the golden model allows to incorporate fewer/smaller guard-bands (e.g., use less pessimistic worst-case assumptions) in the design process. This provides benefits in energy, power, speed, and area while a sufficient (economic) yield is maintained.

Even in systems that are designed for high reliability (e.g., mission critical systems), our method provides an advantage. While those systems will still be designed with margins and high reliability in mind, it is still necessary to consider a potential run-time failure (even though it may be rare). Our method helps to mitigate the impact and stabilize the performance/quality in such a rare case of failure. As such, it contributes to confine the impact of rare failures and reduces the worst-case quality/performance impact.

The nature of many types of errors (failure modes) currently does not allow the use of a variety of statistical techniques (including signal processing) that could mitigate their impact on quality/performance. Our method re-enables the use of a variety of such well-studied and additional novel techniques that would otherwise not be applicable or effective.

Moreover, existing techniques to deal with reliability issues and uncertainties during manufacturing or operation can be divided into two categories:

In industry, the only accepted approach today is the use of guard-bands, possibly supplemented by techniques to minimize these guard bands. However, due to the above described testing issue, a worst-case paradigm with the requirement of 100% reliable operation is undebated and widely considered as "not an option". To the best of our knowledge, no products are on the market that are not designed to provide 100% correct results at all times. Nevertheless, it is well recognized that the corresponding margins are too high for most of the manufactured dies and relaxing them while ensuring minimum quality/performance guarantees (even below the current error free performance) would be of great value.

Despite the hesitance of industry, academia, has enthusiastically promoted the idea of tolerating deviations from the golden model to be able to reduce guard-bands. The corresponding research is known as "approximate computing", an idea that has received significant interest in the last decade. Many publications show that sufficient quality is often easily achievable with relaxed guard bands while tolerating errors and various ideas for mitigation of those errors have bene proposed. Unfortunately, most of these ideas are based on assumptions that are fundamentally wrong. Hence, these ideas cannot be applied in practice, which explains why they have not been adopted by industry. Furthermore, the issue of testing has never really been addressed by academic solutions. The reason for this shortcoming is that the testing issue does not come up with the simplified, but incorrect, academic fault model, which is another important gap between current academic ideas and their application in industry.

The herein presented memory decoder device, and the method of operation of the memory decoder device can close this gap between promising academic ideas that are based on an erroneous simplified model that does not apply in practice and the physical reality that is relevant in industry. We do so by providing a simple means to restore the simple academic fault model from the correct model that is relevant in real industrial design. This not only solves the testing issue (which can indeed be neglected in the academic model), but also allows for the application of many other solutions that have so far not been valid under real-world conditions.

According to some aspects of the invention, the fundamental idea originates from the insight that many sources of error in integrated circuits follow a non-ergodic random process. More specifically, the source of error is a random process (e.g., the manufacturing or a temperature distribution or voltage waveform that depend on a random parameter, including for example the data to be processed). Billions of realizations of this random process exist (e.g., the number of possible manufacturing defects is astronomic). At the same time, given a specific realization of this random process, the behaviour of the circuit is typically not random anymore, but follows a specific pattern (e.g., logic or timing behaviour). Hence, once a pattern manifests (e.g., a specific chip coming out of the fab or a specific data pattern or program that is processed at run-time), the impact of the original fault/issue is often deterministic or follows at least a pattern that is very different from the statistical nature of the original fault. The average behaviour (e.g., over time or multiple subsequent execution of the same data pattern) for a given instance of the random process can therefore not be assumed to be the same as the average behaviour over multiple realizations of the random process. This is especially problematic if for a given random process instance the behaviour is deterministic (as it is for example for manufacturing defects that remain in place once a chip leaved the fab). This different behaviour renders the analysis of the impact of random issues extremely difficult since each failure mode results in a different behaviour (e.g., a different deterministic behaviour or different statistical behaviour). Reliable quality/performance predictions across a population of realizations of the original random process are therefore not easily possible. Furthermore, any average quality/performance that is taken across all realization of the original random process is meaningless for the average (e.g., over time) quality/performance of a specific realization of that process (e.g., a specific chip). This issue becomes specifically problematic, when the manifestation of an issue (that results from a random process) is deterministic. State-of-the-art approximate computing analysis and design techniques in academia almost completely ignore this issue.

The herein presented device, system, and method can alleviate the difference between the realization of the random process and the behaviour of the random process (e.g., over time). It therefore approximately restores an ergodic behaviour. To this end, we propose to add circuitry to a design that randomizes the appearance of a particular fault mode after its manifestation. In this way, the random fault model that determines the fault mode can be maintained even for a given realization. This allows to consider an ergodic fault model in which the random nature of fault mode realization can be exploited in various manners, including for example performance assessment or fault mitigation through replay, averaging, or other signal processing techniques.

With respect to the application to unreliable memories, herein we have described how to implement the above-described restoration of an ergodic fault model for memories with bit-errors that appear during manufacturing. The locations of these errors are determined during manufacturing, but different for each memory instance/chip, which leads to a different behaviour for each chip (e.g., some errors may be in the bits with lower weights, others in bits with high weight). We propose to shuffle the mapping between the physical position of a bit in the memory and its logical address at run-time in a pseudo random manner. This re-creates a fault pattern that appears to be changing even for a specific chip. The error pattern behaviour over time is now random, but identical for all chips, which equalizes the quality of all chips with the same number of errors. We propose two specific examples to realize this idea, but other implementations are possible.

We also propose to further to exploit the restored (pseudo-)random behaviour of faults even for a given fault mode realization. The fundamental insight is that especially in processes that are (almost) deterministic after their realization statistical processing cannot effectively be exploited to mitigate errors due to the lack of randomness. By restoring randomness, we re-enable the effectiveness of statistical signal processing methods to reduce the impact of errors. We illustrate this method with an example implementation: A decoder for an error correcting code is affected by errors in a memory that show only a small variation over time for a specific chip. Hence, without any further measures, even repeating decoding attempts that fail due to errors on the chip provides no or only negligible benefit (in case of a small residual randomness). We add logic to randomize the location of the errors in the memory, as proposed above. Now, each time the same data is decoded the errors impact the decoding in a different way. Repeating the decoding of a failed decoding attempt leads to a successful decoding with high probability and the quality of the result is improved. This example generalizes in a straightforward manner to any other statistical DSP technique that can improve quality based on the availability of multiple realizations of a random process that leads to potential issues.

The concept of the herein presented device and method can extend beyond the specific example of memories. As explained before, it is always applicable when the specific realization of a random process has a notable impact of the behaviour of that process (e.g., over time or data). Randomization can help to unify the behaviour of different process realizations. In the following, we list a few specific example, but further applications are possible:

Integrated circuits often exhibit different temperatures in different parts of the chip. These temperatures change over time, but often slowly (compared to the operating speed) and only partially random. Hence, for a given short period, temperature induced errors are relatively static and cause specific errors whose impact is difficult to characterize. Randomizing workload to avoid high-temperature clusters is a known technique. However, it can not always be applied successfully and temperature clusters in time and space still form. In this respect, the herein presented method and device can be applied instead in a completely different manner in which workload or operations are distributed in time or space to randomize the impact of a given temperature distribution and randomize corresponding errors. In this way, even if the same temperature pattern occurs, the impact is different and an average quality, instead of a specific quality is achieved over repetitions which allows for example to average results.

In a similar manner, it is known that voltage regulators lead to a specific pattern of voltage fluctuations. These typically are repetitive or workload dependent and therefore cause specific (and repetitive) error patterns. Randomizing the voltage fluctuations or work distribution restores a random behaviour which is more convenient to analyse and alleviate.

As a third example, we note that the idea is also specifically applicable to timing errors. These also tend to occur in specific places (paths with low margin). Randomizing voltage or temperature or the data that excites these paths can randomize the impact of timing errors.

The proposed device and method has applications mostly in the design and test of integrated circuits. It has the potential to lead to better circuits that can provide lower power consumption or can be manufactured at lower cost. The idea is mainly applicable in areas in which exact results are anyway not defined (e.g., video compression, audio processing, search engines, AI and ML, communications) since no "correct" solution is available for these problems and performance metrics are anyway only statistical quality metrics (e.g., PSNR, BER, MSE, . . . ). Surprisingly, the idea is also applicable in areas that are safety critical since it does not impact or degrade at all the quality of a 100% reliable system. It only provides an additional safety net in case of unforeseen errors.

To briefly recapitulate, according to some aspects of the present invention, a randomization method is provided to reduce the variation in the behaviour of multiple incarnations of a system that are all built from the same plan, but suffer from different deviations from that plan by incorporating mechanisms that intentionally alter constantly the impact of any such deviation while the system is operated. The randomization method can be applied to derive an average quality metric that applies to each of the circuits by Monte-Carlo simulations. The randomization can also be applied in order to generate different realizations from the same system (by randomizing its behaviour differently each time it is used) with the objective to exploit the variety in the obtained results with signal processing to obtain a better result.

Moreover, the randomiazion method can also be applied to memory with reliability issues, comprising one or multiple memories and a device that changes the mapping between the logical and the physical location of a bit in the memory, allowing to alter the logic location of any physical error in the memory. In addition, the randomization method can be used together with a repeated execution of the same algorithm with different randomizations of the errors, followed by averaging of the corresponding results or by selection of the most probably correct result among the multiple executions. The herein described principle to use a randomization logic to read from a physical memory space can be used for a variety of different applications, for example but not limited to for reading memory of integrated circuits, optical memory devices, image sensors, display devices, communication channels and data transmission devices, for different types of chips and integrated circuits of computers, smartphones, electronic appliances, consumer electronics.

According to one aspect of the present invention, as a specific example, an approximate ergodic LDPC decoder for memory reads in an exemplary 28 nm FD-SOI technology has been proposed. It has been shown with measurement that the memory faults as well as the quality across a population of dies are non-ergodic, and therefore, the fault model commonly-assumed in the previous literature is not correct. Beside verifying of the non-ergodic fault model and the quality distribution, novel approaches to improve the quality of faulty dies by equalizing the quality across the dies and minimizing the impact of memory faults have been provided. Altogether, the herein proposed ergodic LDPC is the first measured example of an integrated circuit that delivers stable performance across a population of dies despite the presence of errors in its memories. As such, it shows that approximate computing is feasible without a complex test procedure and acceptable quality.

While the invention has been disclosed with reference to certain preferred embodiments, numerous modifications, alterations, and changes to the described embodiments are possible without departing from the sphere and scope of the invention, as defined in the appended claims and their equivalents thereof. Accordingly, it is intended that the invention not be limited to the described embodiments, but that it have the full scope defined by the language of the following claims.

REFERENCES

[1] G. Karakonstantis, C. Roth, C. Benkeser, and A. Burg, "On the exploitation of the inherent error resilience of wireless systems under unreliable silicon," in *DAC Design Automation Conference 2012*. IEEE, 2012, pp. 510-515.

[2] L. R. Varshney, "Performance of LDPC codes under faulty iterative decoding," *IEEE Transactions on Information Theory*, vol. 57, no. 7, pp. 4427-4444, 2011.

[3] S. S. T. Yazdi, H. Cho, and L. Dolecek, "Gallager B decoder on noisy hardware," *IEEE Transactions on Communications*, vol. 61, no. 5, pp. 1660-1673, 2013.

[4] A. Balatsoukas-Stimming and A. Burg, "Density evolution for minsum decoding of LDPC codes under unreliable message storage," *IEEE Communications Letters*, vol. 18, no. 5, pp. 849-852, 2014.

[5] C. K. Ngassa, V. Savin, and D. Declercq, "Min-sum-based decoders running on noisy hardware," in *2013 IEEE Global Communications Conference (GLOBECOM)*. IEEE, 2013, pp. 1879-1884.

[6] P. Ivanis and B. Vasi' c, "Error errore eicitur: A stochastic resonance paradigm for reliable storage of information on unreliable media," *IEEE Transactions on Communications*, vol. 64, no. 9, pp. 3596-3608, 2016.

[7] J. Mu, A. Vosoughi, J. Andrade, A. Balatsoukas-Stimming, G. Karakonstantis, A. Burg, G. Falcao, V. Silva, and J. R. Cavallaro, "The impact of faulty memory bit cells on the decoding of spatially-coupled LDPC codes," in *2015 49th Asilomar Conference on Signals, Systems and Computers*. IEEE, 2015, pp. 1627-1631.

[8] A. Balatsoukas-Stimming and A. Burg, "Faulty successive cancellation decoding of polar codes for the binary erasure channel," *IEEE Transactions on Communications*, vol. 66, no. 6, pp. 2322-2332, 2017.

[9] S. Mukhopadhyay, H. Mahmoodi, and K. Roy, "Modeling of failure probability and statistical design of SRAM array for yield enhancement in nanoscaled CMOS," *IEEE transactions on computer-aided design of integrated circuits and systems*, vol. 24, no. 12, pp. 1859-1880, 2005.

[10] C. Roth, C. Studer, G. Karakonstantis, and A. Burgi, "Statistical data correction for unreliable memories," in *2014 48th Asilomar Conference on Signals, Systems and Computers*. IEEE, 2014, pp. 1890-1894.

[11] C. Roth, C. Benkeser, C. Studer, G. Karakonstantis, and A. Burg, "Data mapping for unreliable memories," in *2012 50th Annual Allerton Conference on Communication, Control, and Computing (Allerton)*. IEEE, 2012, pp. 679-685.

[12] F. Frustaci, M. Khayatzadeh, D. Blaauw, D. Sylvester, and M. Alioto, "SRAM for error-tolerant applications with dynamic energy-quality management in 28 nm CMOS," *IEEE Journal of Solid-state circuits*, vol. 50, no. 5, pp. 1310-1323, 2015.

[13] Y. S. Park, D. Blaauw, D. Sylvester, and Z. Zhang, "Low-power highthroughput LDPC decoder using non-refresh embedded DRAM," *IEEE Journal of Solid-State Circuits*, vol. 49, no. 3, pp. 783-794, 2014.

[14] W. Choi, G. Kang, and J. Park, "A refresh-less eDRAM macro with embedded voltage reference and selective read for an area and power efficient Viterbi decoder," *IEEE Journal of Solid-State Circuits*, vol. 50, no. 10, pp. 2451-2462, 2015.

[15] E. Sharon, S. Litsyn, and J. Goldberger, "Efficient serial message-passing schedules for LDPC decoding," *IEEE Transactions on Information Theory*, vol. 53, no. 11, pp. 4076-4091, 2007.

[16] C. Roth, P. Meinerzhagen, C. Studer, and A. Burg, "A 15.8 pJ/bit/iter quasi-cyclic LDPC decoder for IEEE 802.11 n in 90 nm CMOS," in *2010 IEEE Asian Solid-State Circuits Conference*. IEEE, 2010, pp. 1-4.

[17] A. Balatsoukas-Stimming, N. Preyss, A. Cevrero, A. Burg, and C. Roth, "A parallelized layered QC-LDPC decoder for IEEE 802.11 ad," in *2013 IEEE 11th International New Circuits and Systems Conference (NEWCAS)*. IEEE, 2013, pp. 1-4.

[18] S. Ganapathy, G. Karakonstantis, A. Teman, and A. Burg, "Mitigating the impact of faults in unreliable memories for error-resilient applications," in *2015 52nd ACM/EDAC/IEEE Design Automation Conference (DAC)*. IEEE, 2015, pp. 1-6.

[19] I. Lee, J. Kwon, J. Park, and J. Park, "Priority based error correction code (ECC) for the embedded SRAM memories in H. 264 system," *Journal of Signal Processing Systems*, vol. 73, no. 2, pp. 123-136, 2013.

[20] F. Frustaci, M. Khayatzadeh, D. Blaauw, D. Sylvester, and M. Alioto, "13.8 A 32 kb SRAM for error-free and error-tolerant applications with dynamic energy-quality management in 28 nm CMOS," in *2014 IEEE International Solid-State Circuits Conference Digest of Technical Papers (ISSCC)*. IEEE, 2014, pp. 244-245.

[21] P. Meinerzhagen, C. Roth, and A. Burg, "Towards generic low-power area-efficient standard cell based memory architectures," in *2010 53rd IEEE International Midwest Symposium on Circuits and Systems*. IEEE, 2010, pp. 129-132.

[22] P. Meinerzhagen, A. Bonetti, G. Karakonstantis, C. Roth, F. Giirkaynak, and A. Burg, "Refresh-free dynamic standard-cell based memories: Application to a

[23] P. Meinerzhagen, A. Teman, R. Giterman, N. Edri, A. Burg, and A. Fish, *Gain-cell Embedded DRAMs for Low-power VLSI Systems-on-chip*. Springer, 2018.

[24] R. Giterman, A. Bonetti, E. V. Bravo, T. Noy, A. Teman, and A. Burg, "Current-Based Data-Retention-Time characterization of Gain-Cell embedded DRAMs across the design and variations space," *IEEE Transactions on Circuits and Systems I: Regular Papers*, 2020.

[25] A. Teman, G. Karakonstantis, R. Giterman, P. Meinerzhagen, and A. Burg, "Energy versus data integrity tradeoffs in embedded highdensity logic compatible dynamic memories," in 2015 Design, Automation & *Test in Europe Conference & Exhibition (DATE)*. IEEE, 2015, pp. 489-494.

[26] M. Patras,cu and M. Thorup, "The power of simple tabulation hashing," *Journal of the ACM (JACM)*, vol. 59, no. 3, pp. 1-50, 2012.

[27] M. Milicevic and P. G. Gulak, "A multi-Gb/s frame-interleaved LDPC decoder with path-unrolled message passing in 28-nm CMOS," *IEEE Transactions on Very Large Scale Integration (VLSI) Systems*, vol. 26, no. 10, pp. 1908-1921, 2018.

[28] H. Lopez, H.-W. Chan, K.-L. Chiu, P.-Y. Tsai, and S.-J. J. Jou, "A 75 Gb/s/mm 2 and Energy-Efficient LDPC Decoder Based on a Reduced Complexity Second Minimum Approximation Min-Sum Algorithm," *IEEE Transactions on Very Large Scale Integration (VLSI) Systems*, vol. 28, no. 4, pp. 926-939, 2019.

The invention claimed is:

1. A method of accessing a memory space of a memory device, the memory space having memory faults, comprising the steps of:
 performing a memory access operation by an electronic device to a access a logical memory space of the memory device; and
 randomizing the memory access operation with a randomization logic to access data from a physical memory space based on the logical memory space, the randomization logic providing time varying behavior for accessing the physical memory space.

2. The method of claim 1, wherein the randomization logic includes a counter and uses a hash value that changes over time.

3. The method of claim 2, wherein the randomization logic is configured to generate an address for the physical memory space based on a logical address and the hash value.

4. The method of claim 1, wherein the randomization logic is configured to change an arrangement of bits within a data word that is read from or written to the physical memory space, such that a permutation of the bits of the read data word and a permutation of the bits of the written data word are inversed.

5. The method of claim 1, wherein the randomization logic is used in the memory space of a low-density parity check (LDPC) decoder and the LDPC decoder repeats the memory access operation with different memory space randomizations.

6. A decoder device for accessing a memory space, comprising:
 an input port for receiving a memory access instruction;
 a data processor for randomizing a memory access operation with a randomization logic to access data from a physical memory space of a memory based on the memory access instruction, the randomization logic providing an ergodic model for reading the physical memory space of the memory;
 an output port for physically linking the data processor to the memory for the memory access operation.

7. The decoder of claim 6, wherein the randomization logic includes a counter and uses a hash value that changes over time.

8. The decoder of claim 7, wherein the randomization logic is configured to generate an address for the physical memory space based on a logical address and the hash value.

9. The decoder of claim 6, wherein the randomization logic is configured to change an arrangement of bits within a data word that is read from or written to the physical memory space, such that a permutation of the bits of the read data word and a permutation of the bits of the written data word are inversed.

10. The decoder of claim 6, wherein the randomization logic is used in the memory space of a low-density parity check (LDPC) decoder and the LDPC decoder repeats the memory access operation with different memory space randomizations.

11. A system comprising:
 a electronic device performing a memory access operation;
 a memory device having a physical memory space with faults,
 a logic circuit for receiving the memory access operation and for accessing the physical memory space of the memory device;
 wherein the logic circuit is configured to randomize the memory access operation with a randomization logic to access data in the physical memory space, the randomization logic providing a time varying behavior for accessing the physical memory space.

12. The system of claim 11, wherein the randomization logic includes a counter and uses a hash value that changes over time.

13. The system of claim 12, wherein the randomization logic is configured to generate an address for the physical memory space based on a logical address and the hash value.

14. The system of claim 11, wherein the randomization logic is configured to change an arrangement of bits within a data word that is read from or written to the physical memory space, such that a permutation of the bits of the read data word and a permutation of the bits of the written data word are inversed.

15. The decoder of claim 11, wherein the randomization logic is used in the memory space of a low-density parity check (LDPC) decoder and the LDPC decoder repeats the memory access operation with different memory space randomizations.

16. A method of allocating processing resources of a data processor device, the processing resources having faults, comprising the steps of:
 performing an allocation of a data processing resource from a plurality of data processing resources of a data processor device to perform a data operation; and
 randomizing the allocation of the data processing resource with a randomization logic to allocate a randomly-chased one of the plurality of data processing resources, the randomization logic providing time varying behavior for allocation of the data processing resource.

* * * * *